US011594291B2

(12) United States Patent
Kim

(10) Patent No.: US 11,594,291 B2
(45) Date of Patent: Feb. 28, 2023

(54) SEMICONDUCTOR MEMORY DEVICE AND METHOD OF OPERATING THE SAME

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/237,849

(22) Filed: Apr. 22, 2021

(65) Prior Publication Data
US 2022/0122679 A1      Apr. 21, 2022

(30) Foreign Application Priority Data

Oct. 20, 2020    (KR) ........................ 10-2020-0136174

(51) Int. Cl.
| | | |
|---|---|---|
| G11C 16/34 | (2006.01) | |
| G11C 16/10 | (2006.01) | |
| G11C 16/08 | (2006.01) | |
| G11C 16/26 | (2006.01) | |
| G11C 16/30 | (2006.01) | |
| G11C 16/14 | (2006.01) | |

(52) U.S. Cl.
CPC .......... *G11C 16/3459* (2013.01); *G11C 16/08* (2013.01); *G11C 16/102* (2013.01); *G11C 16/14* (2013.01); *G11C 16/26* (2013.01); *G11C 16/30* (2013.01)

(58) Field of Classification Search
CPC ... G11C 16/3459; G11C 16/08; G11C 16/102; G11C 16/14; G11C 16/26; G11C 16/30; G11C 2211/5621; G11C 2211/5641; G11C 11/5628; G11C 16/10; G11C 16/0483; G11C 16/24
USPC ..................................................... 365/185.22
See application file for complete search history.

(56) References Cited

U.S. PATENT DOCUMENTS

| 10,977,173 B2* | 4/2021 | Li ........................ G06F 12/0253 |
| 2022/0093193 A1* | 3/2022 | Wan .................... G11C 11/5671 |
| 2022/0100622 A1* | 3/2022 | Park ........................ G11C 29/44 |

FOREIGN PATENT DOCUMENTS

| KR | 1020150093006 A | 8/2015 |
| KR | 1020150103532 A | 9/2015 |

* cited by examiner

*Primary Examiner* — Fernando Hidalgo
(74) *Attorney, Agent, or Firm* — William Park & Associates Ltd.

(57) ABSTRACT

A semiconductor memory device includes a memory block and a peripheral circuit. The memory block includes normal pages and buffer pages. Each of the normal pages includes memory cells that store the N bits of data. Each of the buffer pages includes memory cells that store one bit of data. The peripheral circuit receives a first page data and performs a single level cell (SLC) program on the first page data in a first buffer page. In addition, the peripheral circuit receives a second page data and performs the SLC program on the second page data in a second buffer page. In addition, the peripheral circuit performs a multiple-level program operation on a normal page based on the first and second page data programmed in the first and second buffer page, respectively.

14 Claims, 27 Drawing Sheets

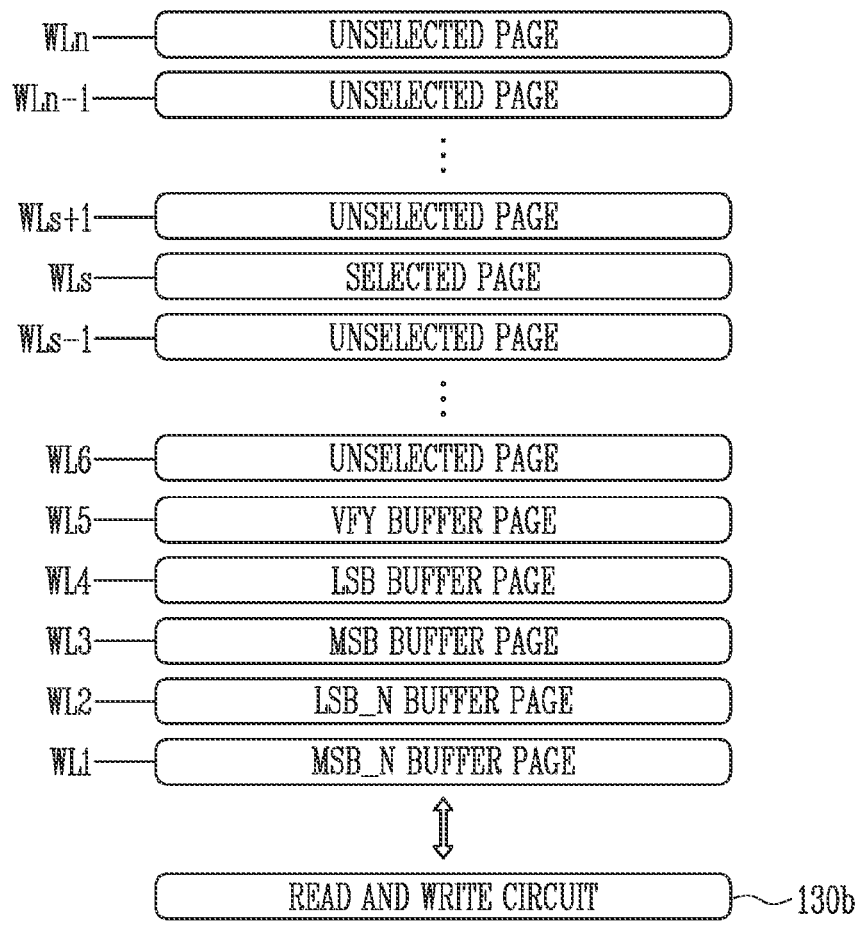

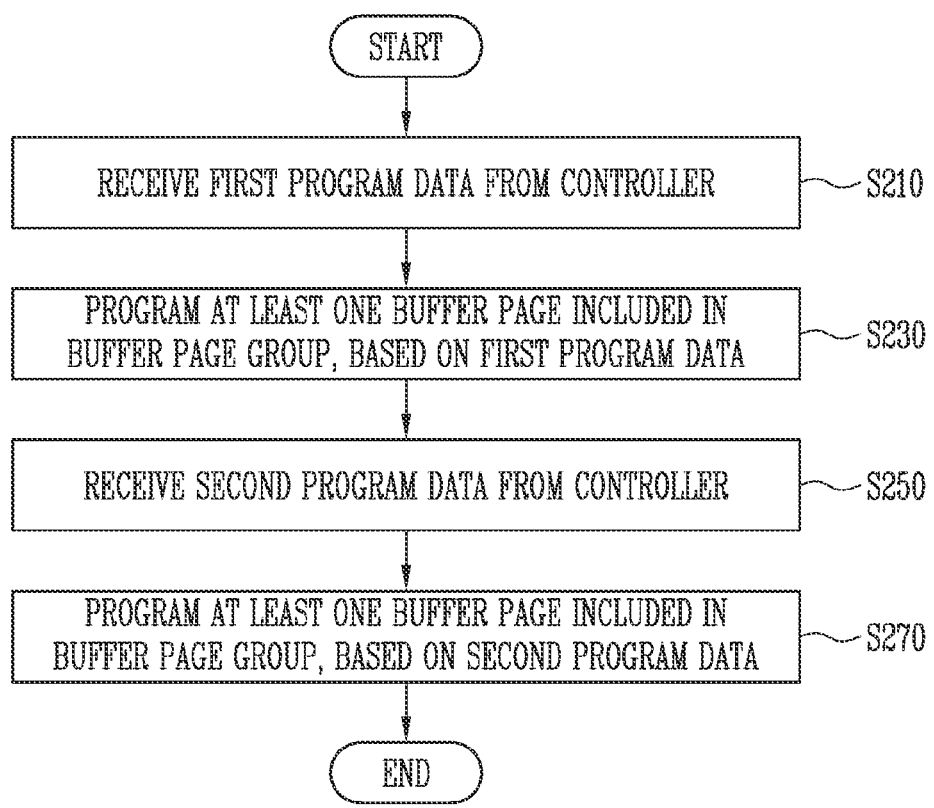

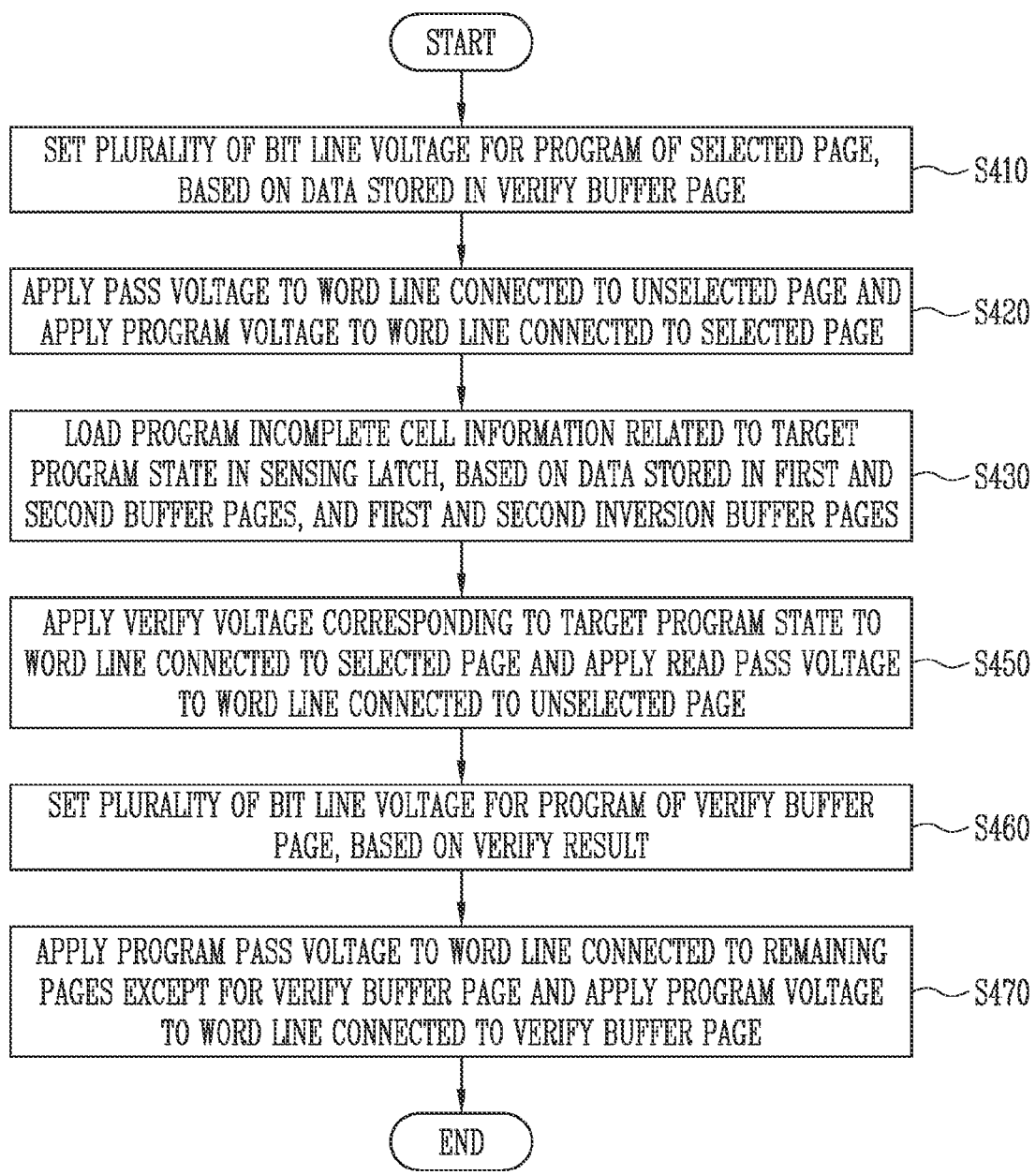

| VFY-PV1 | E | PV1 | PV2 | PV3 |
|---|---|---|---|---|
| LSB | 1 | 1 | 0 | 0 |
| MSB_N | 0 | 1 | 1 | 0 |
| Result | Off | On | Off | Off |

| VFY-PV2 | E | PV1 | PV2 | PV3 |
|---|---|---|---|---|
| LSB_N | 0 | 0 | 1 | 1 |
| MSB_N | 0 | 1 | 1 | 0 |
| Result | Off | Off | On | Off |

| VFY-PV3 | E | PV1 | PV2 | PV3 |
|---|---|---|---|---|
| LSB_N | 0 | 0 | 1 | 1 |
| MSB | 1 | 0 | 0 | 1 |
| Result | Off | Off | Off | On |

|     | E | PV1 | PV2 | PV3 | PV4 | PV5 | PV6 | PV7 |
|-----|---|-----|-----|-----|-----|-----|-----|-----|
| LSB | 1 | 1   | 1   | 0   | 0   | 0   | 1   | 0   |
| CSB | 1 | 1   | 0   | 1   | 1   | 0   | 0   | 0   |
| MSB | 1 | 0   | 1   | 1   | 0   | 1   | 0   | 0   |

|   | E | PV1 | PV2 | PV3 | PV4 | PV5 | PV6 | PV7 |
|---|---|---|---|---|---|---|---|---|
| LSB | 1 | 1 | 1 | 0 | 0 | 0 | 1 | 0 |
| CSB | 1 | 1 | 0 | 1 | 1 | 0 | 0 | 0 |
| MSB | 1 | 0 | 1 | 1 | 0 | 1 | 0 | 0 |
| LSB_N | 0 | 0 | 0 | 1 | 1 | 1 | 0 | 1 |
| CSB_N | 0 | 0 | 1 | 0 | 0 | 1 | 1 | 1 |
| MSB_N | 0 | 1 | 0 | 0 | 1 | 0 | 1 | 1 |

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0136174 filed on Oct. 20, 2020, in the Korean intellectual Property Office, the entire disclosure of which is incorporated by reference herein.

BACKGROUND

1, Technical Field

The present disclosure relates to an electronic device, and more particularly, to a semiconductor memory device and a method of operating the same.

2, Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional semiconductor memory device is a memory device designed in order to resolve a limit of integration of a two-dimensional memory semiconductor device and may include a plurality of memory cells that are vertically stacked on the semiconductor substrate.

SUMMARY

A semiconductor memory device according to an embodiment of the present disclosure includes a memory block and a peripheral circuit. The memory block includes a plurality of memory cells. The peripheral circuit performs a program operation on the memory block. The memory block includes a plurality of normal pages and a plurality of buffer pages. Each of the plurality of normal pages includes memory cells that store N bits of data (N being a natural number that is equal to or greater than 2). Each of the plurality of buffer pages includes memory cells that store one bit of data. The peripheral circuit receives a first page data and performs a single level cell (SLC) program on the first page data in at least a first buffer page among the plurality of buffer pages. In addition, the peripheral circuit receives a second page data and performs the SLC program on the second page data in at least a second buffer page among the plurality of buffer pages. In addition, the peripheral circuit is configured to perform a multiple-level program operation on a selected normal page among the plurality of normal pages based on the first page data that is programmed in the first buffer page and the second page data that is programmed in the second buffer page.

According to another embodiment of the present disclosure, a method of operating a semiconductor memory device for programming data in a memory block including a plurality of buffer pages and a plurality of normal pages is provided. Each of the plurality of buffer pages and normal pages includes a plurality of memory cells. The plurality of buffer pages belongs to a buffer page group and a plurality of normal pages belongs to a normal page group. The method of operating the seal conductor memory device includes performing a single-level cell (SLC) program operation on the buffer page group based on first and second program data, and performing a multiple-level program operation on the normal page group based on the first and second program data that are programmed in the buffer page group.

A semiconductor memory device according to another embodiment of the present disclosure includes a memory block and a peripheral circuit. The memory block includes a plurality of memory cells. The peripheral circuit performs a program operation on the memory block. The memory block includes a plurality of normal pages and a plurality of buffer pages. Each of the plurality of normal pages includes memory cells that stores the N bits of data (N being a natural number that is equal to or greater than 2). Each of the plurality of buffer pages includes memory cells that stores one bit of data. The peripheral circuit receives a page data, and performs a single level cell (SLC) program on the page data in at least one buffer page among the plurality of buffer pages. In addition, the peripheral circuit perform a multiple-level program operation on a selected normal page among the plurality of normal pages based on the page data that is programmed in the at least one buffer page.

BRIEF DESCRIPTION OF THE DRAWINGS

FIG. 10 is a block diagram schematically illustrating a structure of a memory block for performing a program operation of a semiconductor memory device according to an embodiment of the present disclosure.

FIG. 11A is a table illustrating an exemplary embodiment of a logic code for programming a multi-level cell (MLC).

FIG. 13 is a flowchart illustrating an exemplary embodiment of step S110 of FIG. 12.

FIG. 17 is a flowchart illustrating an exemplary embodiment of step S130 of FIG. 12.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

An embodiment of the present disclosure provides a semiconductor memory device capable of reducing a size of a peripheral circuit, and a method of operating the same.

The present technology may provide a semiconductor memory device capable of reducing a size of a peripheral circuit, and a method of operating the same.

Figure 1:
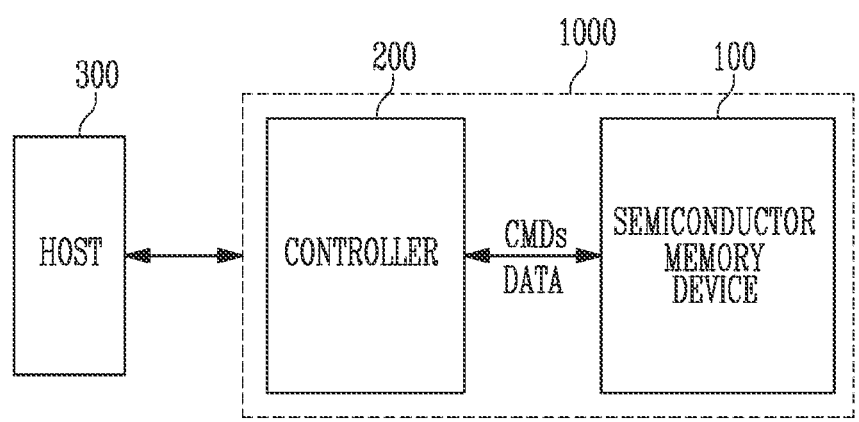
FIG. 1 is a block diagram illustrating a memory system with a controller and a semiconductor memory device.

FIG. 1 is a block diagram illustrating a memory system with a controller and a semiconductor memory device.

Referring to FIG. 1 the memory system 1000 may include the semiconductor memory device 100 and the controller 200. In addition, the memory system 1000 may communicate with a host 300. In addition, the controller 200 may control an overall operation of the semiconductor memory device 100 by transferring commands CMDs based on requests that are received from the host 300. In addition, the controller 200 may transfer data DATA corresponding to each of the commands CMDs to the semiconductor memory device 100 or may receive the data DATA from the semiconductor memory device 100. For example, when a program request and program data are received from the host 300, the controller 200 may transfer a program command and program data, corresponding thereto, to the semiconductor memory device 100. In another example, when receiving a read request from the host 300, the controller 200 may transfer a read command, corresponding thereto, to the semiconductor memory device 100. Thereafter, the semiconductor memory device 100 may transfer read data, corresponding to the read command, to the controller 200.

When the memory system 1000 switches from a turn-off state to a turn-on state, a booting operation of the memory system 1000 may be performed. The booting operation of the memory system 1000 may include an operation of scanning a current state of a plurality of memory blocks that are included in the semiconductor memory device 100 and storing the scanned state of each of the memory blocks in a memory that is inside the controller 200. For example, a plurality of memory blocks that are included in the semiconductor memory device 100 may be in one of an erase state (or erased state), a program state (or programmed state), and an open state (or opened state). When data is not stored in all of the physical pages that are included in the memory block and all of the cells that are included in the corresponding memory block are in the erase state, the memory block is in the erase state. When data is stored in all of the physical pages that are included in the memory block, the memory block is in the program state. When data is stored in some of the physical pages that are included in the memory block and data is not stored in some physical pages, the corresponding memory block is in the open state. The state of a corresponding memory block may be determined by sequentially reading data of the pages that are included in the memory block. To this end, the controller 200 may generate a plurality of read commands to read the data of the pages that are included in the memory block and transfer the plurality of read commands to the semiconductor memory device 100. The semiconductor memory device 100 may perform a read operation corresponding to the received read command, and may transfer data that is read as a result of the read operation to the controller 200.

Figure 2:
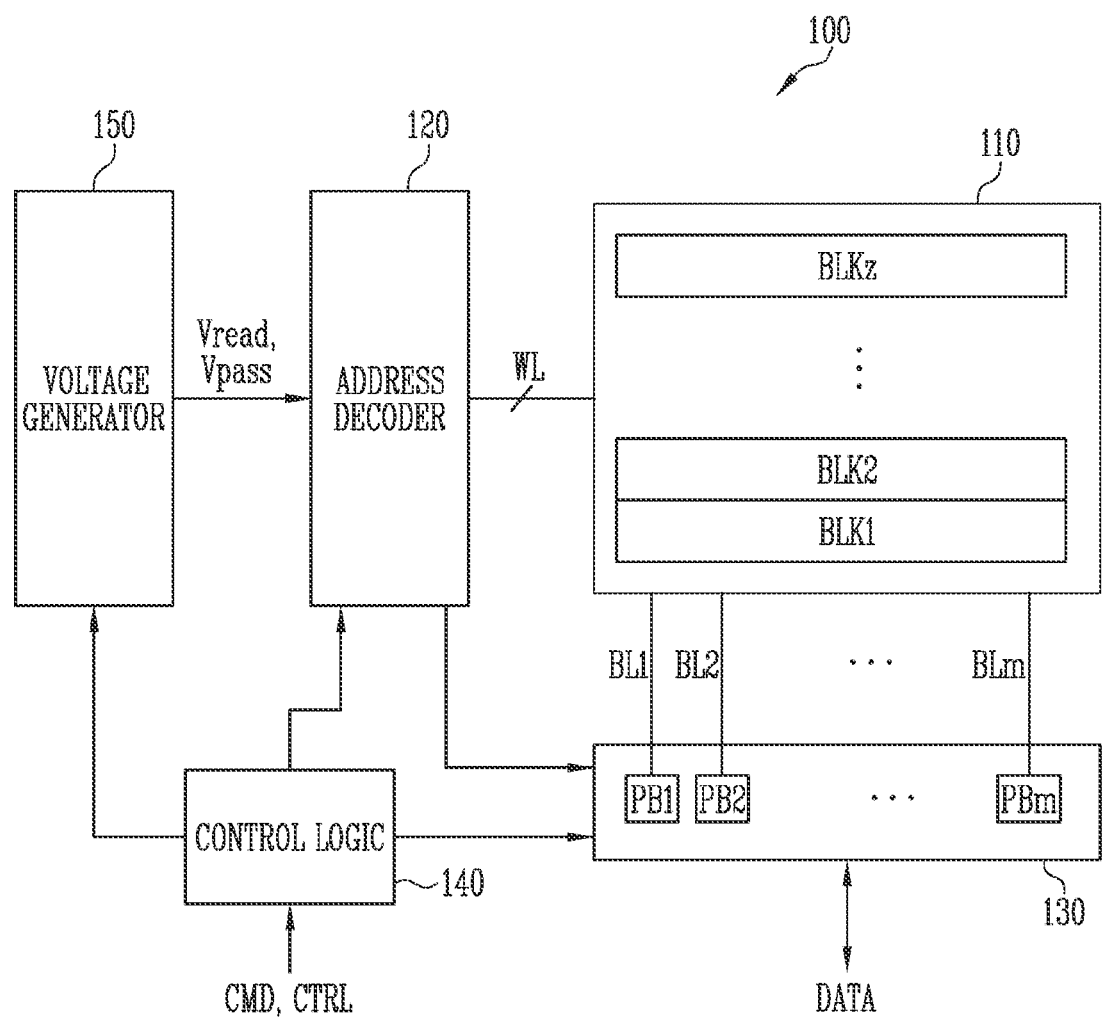
FIG. 2 is a block diagram illustrating an exemplary embodiment of the semiconductor memory device of FIG. 1.

FIG. 2 is a block diagram illustrating an exemplary embodiment of the semiconductor memory device of FIG. 1.

Referring to FIG. 2, the semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The plurality of memory blocks BLK1 to BLKz may be connected to the address decoder 120 through word lines WL, The plurality of memory blocks BLK1 to BLKz may be connected to the read and write circuit 130 through bit lines BL1 to BLm. Each of the plurality of memory blocks BLK1 to BLKz may include a plurality of memory cells. In an embodiment, the plurality of memory cells are non-volatile memory cells and may be configured of non-volatile memory cells with a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells that are included in the memory cell array may store at least one bit of data. In an embodiment, each of the plurality of memory cells that are included in the memory cell array 110 may be a single-level cell (SLC) storing one bit of data. In another embodiment, each of the plurality of memory cells that are included in the memory cell array 110 may be a multi-level cell (MLC) that stores two bits of data. In still another embodiment, each of the plurality of memory cells that are included in the memory cell array 110 may be a triple-level cell (TLC) that stores three bits of data. In still another embodiment, each of the plurality of memory cells that are included in the memory cell array 110 may be a quad-level cell (QLC) that stores four bits of data. According to an embodiment, the memory cell array 110 may include a plurality of memory cells, each storing five or more bits of data.

The address decoder 120, the read and write circuit 130, and the voltage generator 150 may operate as a peripheral circuit that drives the memory cell array 110. At this time, the peripheral circuit operates based on the control logic 140, The address decoder 120 may be connected to the memory cell array 110 through the word lines WL. The address decoder 120 may be configured to operate in response to control of the control logic 140. The address decoder 120 may receive an address through an input/output buffer (not shown) inside the semiconductor memory device 100.

The address decoder 120 may be configured to decode a block address among received addresses. The address decoder 120 may select at least one memory block according to the decoded block address. In addition, the address decoder 120 may apply a read voltage read that is generated in the voltage generator 150 to a selected word line of the selected memory block at a time of a read voltage application operation during a read operation and may apply a pass voltage Vpass to the remaining unselected word lines. In addition, during a program verify operation, the address decoder 120 may apply a verify voltage that is generated in the voltage generator 150 to the selected word line of the selected memory block and may apply the pass voltage Vpass to the remaining unselected word lines.

The address decoder 120 may be configured to decode a column address of the received addresses. The address decoder 120 may transmit the decoded column address to the read and write circuit 130.

A read operation and a program operation of the semiconductor memory device 100 may be performed in a page unit, Addresses that are received at a time of a request of the read operation and the program operation may include a block address, a row address, and a column address. The address decoder 120 may select one memory block and one word line based on the block address and the row address. The column address may be decoded by the address decoder 120 and may be provided to the read and write circuit 130.

A plurality of memory cells that are connected to one word line may configure one physical page. When each of the plurality of memory cells that are included in the semiconductor memory device is a single-level cell (SLC) that stores one bit, one logical page data may be stored in one physical page. When each of the plurality of memory cells that are included in the semiconductor memory device is a multi-level cell (MLC) that stores two bits, two logical page data, for example, a most significant bit (MSB) page data and a least significant bit (LSB) page data may be stored in one physical page. When each of the plurality of memory cells that are included in the semiconductor memory device is a triple-level cell (TLC) that stores three bits, three logical page data, for example, an MSB page data, a central significant bit (CSB) page data and an LSB page data may be stored in one physical page. When each of the plurality of memory cells that are included in the semiconductor memory device is a quad-level cell (QLC) that stores four bits, four logical page data, for example, MSB page data, high central significant bit (RCSB) page data, low central significant bit (LCSB) page data, and LSB page data may be stored in one physical page.

The address decoder 120 may include a block decoder, a row decoder, a column decoder, an address buffer, and the like.

The read and write circuit 130 may include a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm may be connected to the memory cell array 110 through the bit lines BL1 to BLm. During the read operation and the program verify operation, in order to sense a threshold voltage of the memory cells, the plurality of page buffers PB1 to PBm may sense a change in the amount of current flowing based on a program state of a corresponding memory cell through a sensing node while continuously supplying a sensing current to the bit lines that are connected to the memory cells and may latch the sensed change as sensing data. The read and write circuit 130 may operate in response to page buffer control signals that are output from the control logic 140.

During the read operation, the read and write circuit 130 may sense the data of the memory cell, may temporarily store read data, and may output data DATA to the input/output buffer (not shown) of the semiconductor memory device 100. In an exemplary embodiment, the read and write circuit 130 may include a column select circuit, and the like, in addition to the page buffers (or page registers).

The control logic 140 may be connected to the address decoder 120, the read and write circuit 130, and the voltage generator 150, The control logic 140 may receive a command CMD and a control signal CTRL through the input/output buffer lot shown) of the semiconductor memory device 100. The control logic 140 may be configured to control overall operations of the semiconductor memory device 100 in response to the control signal CTRL, In addition, the control logic 140 may output a control signal that adjusts a sensing node pre-charge potential level of the plurality of page buffers PB1 to PBm. The control logic 140 may control the read and write circuit 130 to perform the read operation of the memory cell array 110, The control logic may control the voltage generator 150 to generate various voltages that are used during the program operation of the memory cell array 110. In addition, the control logic 140 may control the address decoder 120 to transfer the voltages that are generated by the voltage generator 150 to local lines of a memory block to be operated through global lines. Meanwhile, the control logic 140 may control the read and write circuit 130 to read data of a selected page of the memory block through the bit lines BL1 to BLm and may store the data in the page buffers PB1 to PBm during the read operation. In addition, the control logic 140 may control the read and write circuit 130 to program the data that is stored in the page buffers PB1 to PBm in the selected page during the program operation.

The voltage generator 150 may generate the read voltage Vread and the pass voltage Vpass during the read operation in response to the control signal output from the control logic 140. In order to generate a plurality of voltages with various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs a read operation, a write operation, and an erase operation on the memory cell array 110. The peripheral circuit may perform the read operation, the write operation, and the erase operation on the memory cell array 110 based on the control of the control logic 140.

Figure 3:
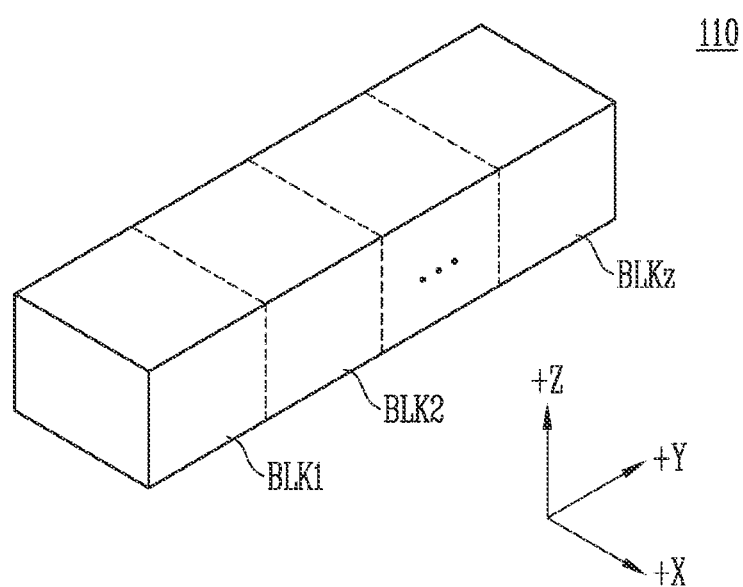
FIG. 3 is a block diagram illustrating an embodiment of a memory cell array 110 of FIG. 2.

FIG. 3 is a block diagram illustrating an embodiment of the memory cell array 110 of FIG. 2.

Referring to FIG. 3, the memory cell array 110 may include a plurality of memory blocks BLK1 to BLKz. Each memory block has a three-dimensional structure, Each memory block may include a plurality of memory cells stacked on a substrate. Such plurality of memory cells are arranged along a +X direction, a +Y direction, and a +Z direction. A structure of each memory block is described in more detail with reference to FIGS. 3 and 4.

Figure 4:
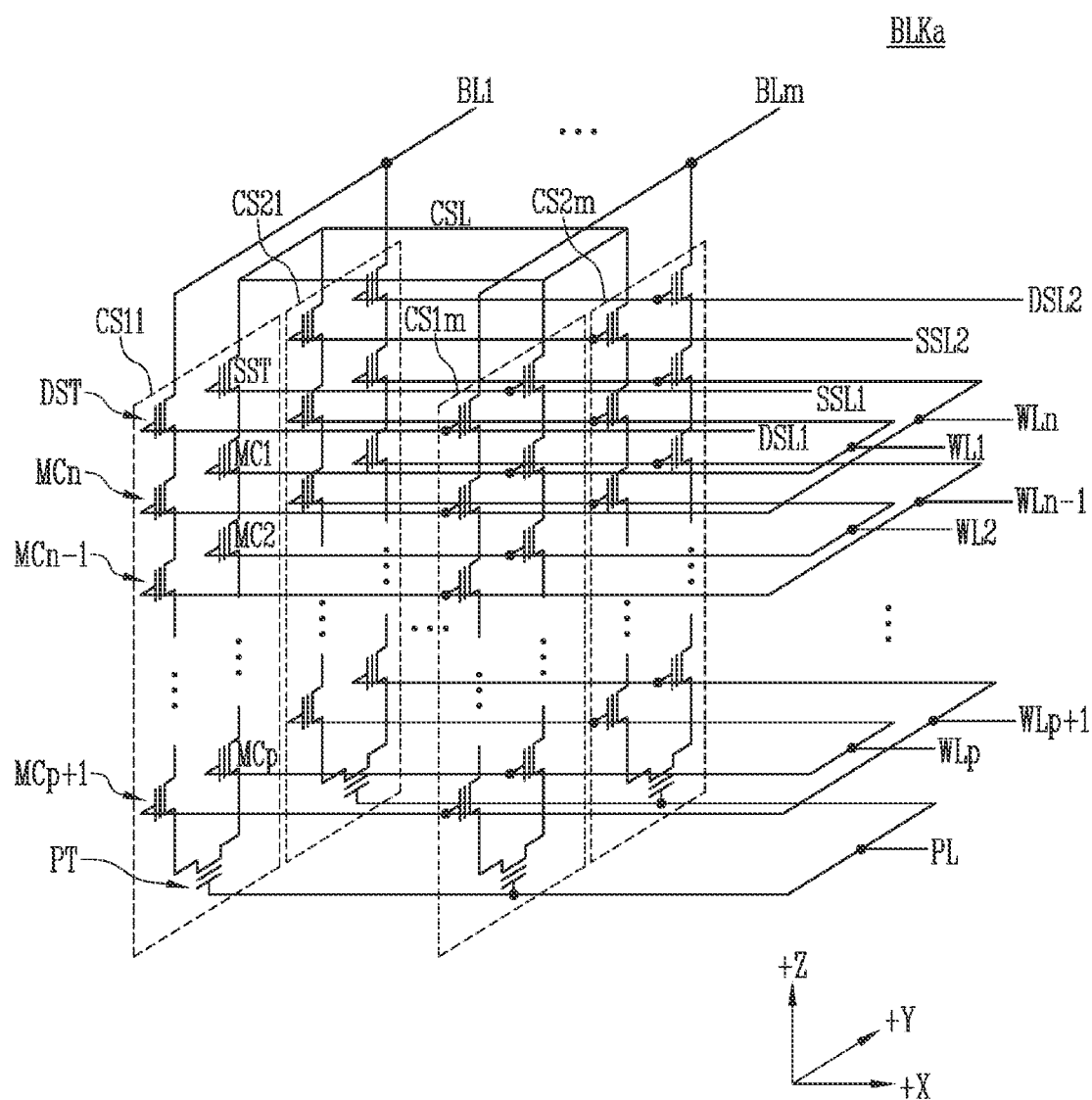
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLK may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings may be arranged in a row direction (that is, the +X direction). In FIG. 4, two cell strings may be arranged in a column direction (that is, the +Y direction). However, this is for convenience of description and it may be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string may be connected between a common source line CSL and the memory cells MC1 to MCp.

In an embodiment, the source select transistors of the cell strings that are arranged in the same row may be connected to a source select line that may extend in the row direction, and the source select transistors of the cell strings that are arranged in different rows may be connected to different source select lines. In FIG. 3, the source select transistors of the cell strings CS11 to CS1m of a first row may be connected to a first source select line SSL1, The source select transistors of the cell strings CS21 to CS2m of a second row may be connected to a second source select line SSL2.

In another embodiment, the source select transistors of the cell strings CS11 to CS1m and CS21 to CS2m may be commonly connected to one source select line.

The first to n-th memory cells MC1 to MCn of each cell string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a −Z direction and may be connected in series between the source select transistor SST and the pipe transistor PT. The (p+1)-th to n-th memory cells MCp+1 to MCn are sequentially arranged in the +Z direction and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. The gates of the first to n-th memory cells MC1 to MCn of each cell string may be connected to the first to n-th word lines WL1 to WLn, respectively.

The gate of the pipe transistor PT of each cell string may be connected to a pipeline PL.

The drain select transistor DST of each cell string may be connected between a corresponding bit line and the memory cells MCp+1 to MCn. The cell strings that are arranged in the row direction may be connected to the drain select line that may extend in the row direction. The drain select transistors of the cell strings CS11 to CS1m of the first row may be connected to a first drain select line DSL1. The drain select transistors of the cell strings CS21 to CS2m of the second row may be connected to a second drain select line DSL2.

Figure 5:
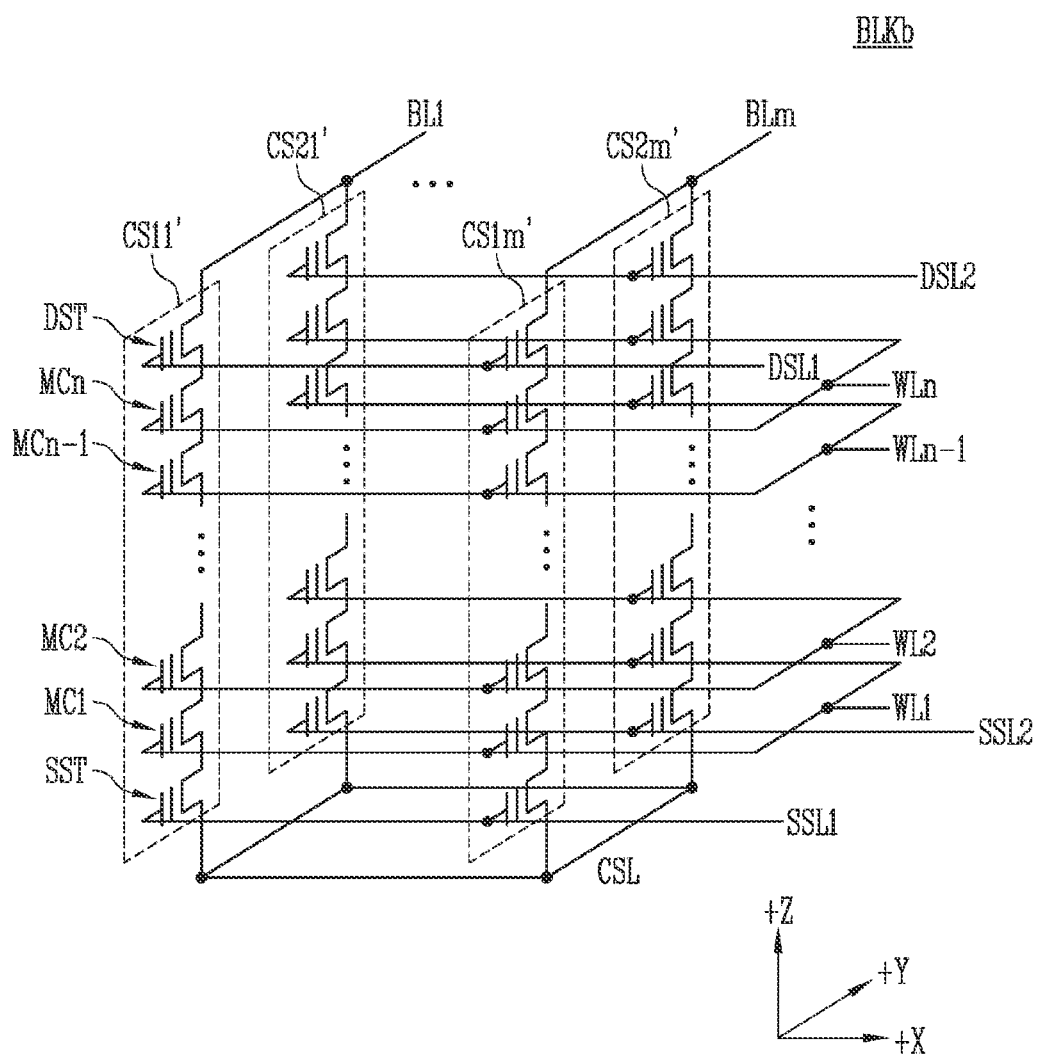
FIG. 5 is a circuit diagram illustrating another embodiment of any one memory block BLKb among the memory blocks BLK1 to BLKz of FIG. 3.

The cell strings that are arranged in the column direction may be connected to the bit lines extending in the column direction. In FIG. 5, the cell strings CS11 and CS21 of the first column may be connected to the first bit line BL1. The cell strings CS1m and CS2m of the m-th column may be connected to the n-th bit line BLm.

The memory cells that are connected to the same word line in the cell strings that are arranged in the row direction may configure one page. For example, the memory cells that are connected to the first word line WL1, among the cell strings CS11 to CS1m of the first row, may configure one page. The memory cells that are connected to the first word line WL1, among the cell strings CS21 to CS2m of the second row, may configure another page. The cell strings that are arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1m or CS21 to CS2m that are arranged in the row direction may be connected to the bit lines, and odd-numbered cell strings among the cell strings CS11 to CS1m or CS21 to CS2m that are arranged in the row direction may be connected to odd bit lines, respectively.

In an embodiment, at least one of the first to n-th memory cells MC1 to MCn may be used as a dummy memory cell. For example, at least one dummy memory cell may be provided to reduce an electric field between the source select transistor SST and the memory cells MC1 to MCp. Alternatively, at least one dummy memory cell may be provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may decrease.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage that is applied to dummy word lines that are connected to the respective dummy memory cells.

FIG. 5 is a circuit diagram illustrating another embodiment of any one memory block BLKb among the memory blocks BLK1 to BLKz of FIG. 4.

Referring to FIG. 5, the memory block BLKb may include a plurality of cell strings CS11' to CS1m' and CS21' to CS2m', Each of the plurality of cell strings CS11' to CS1m' and CS21' to CS2m' may extend along a +Z direction. Each of the plurality of cell strings CS11' to CS1m' and CS21' to CS2m' ay include at least one source select transistor SST, first to n-th memory cells MC1 to MCn, and at least one drain select transistor DST that are stacked on a substrate (not shown) under the memory block BLK1'.

The source select transistor SST of each cell string may be connected between a common source line CSL and memory cells MC1 to MCn. The source select transistors of the cell strings that are arranged in the same row may be connected to the same source select line. The source select transistors of the cell strings CS11' to CS1m' that are arranged in a first row may be connected to a first source select line SSL1. The source select transistors of the cell strings CS21' to CS2m' that are arranged in a second row may be connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string may be connected in series between the source select transistor SST and the drain select transistor DST. The gates of the first to n-th memory cells MC1 to MCn may be connected to first to the n-th word lines WL1 to WLn, respectively.

The drain select transistor DST of each cell string may be connected between a corresponding bit line and the memory cells MC1 to MCn. The drain select transistors of the cell strings that are arranged in the row direction may be connected to a drain select line that extends in the row direction. The drain select transistors of the cell strings CS11' to CS1 m' of a first row may be connected to a first drain select line DSL1. The drain select transistors of the cell strings CS21' to CS2m' of a second row may be connected to a second drain select line DSL2.

As a result, the memory block BLKb of FIG. 5 may have an equivalent circuit that is similar to that of the memory block BLKa of FIG. 4, except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' that are arranged in the row direction may be connected to even bit lines, and odd-numbered cell strings among the cell strings CS11' to CS1m' or CS21' to CS2m' that are arranged in the row direction may be connected to odd bit lines, respectively.

In an embodiment, at least one of the first to n-th memory cells MC1 to MCn may be used as a dummy memory cell. For example, at least one dummy memory cell may be provided to reduce an electric field between the source select transistor SST and the memory cells MC1 to MCn. Alternatively, at least one dummy memory cell may be provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may decrease.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage that is applied to the dummy word lines that are connected to the respective dummy memory cells.

Figure 6:
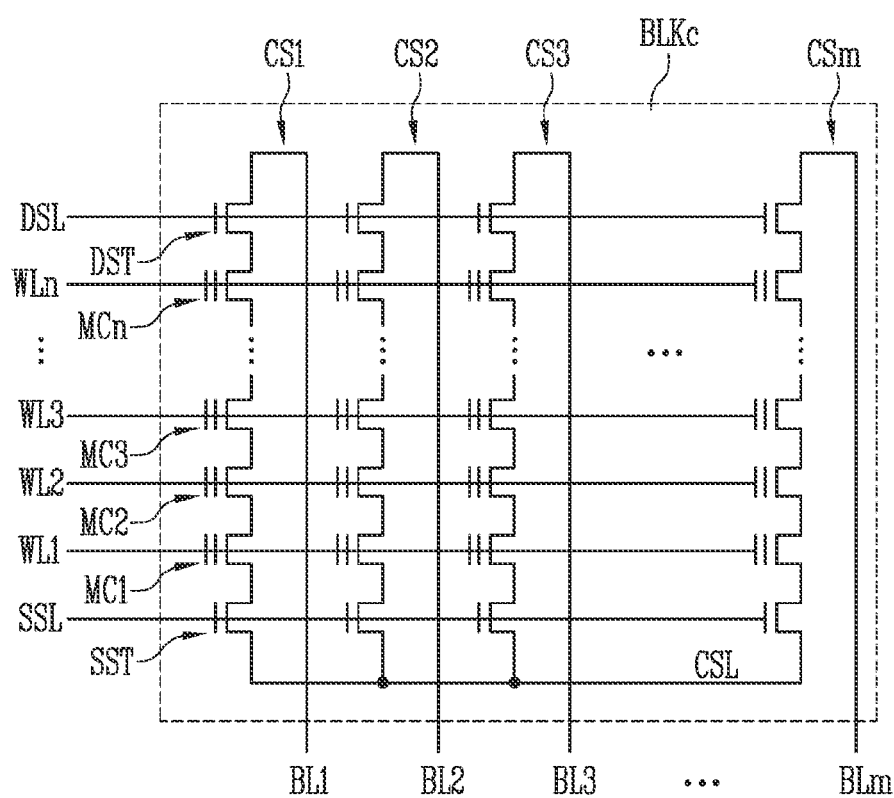
FIG. 6 is a circuit diagram illustrating an embodiment of any one memory block BLKc among the memory blocks BLK1 to BLKz included in the memory cell array 110 of FIG. 2.

FIG. 6 is a circuit diagram illustrating an embodiment of any one memory block BLKc among the memory blocks BLK1 to BLKz included in the memory cell array 110 of FIG. 2.

Referring to FIG. 6, the memory block BLKc may include a plurality of cell strings CS1 to CSm. The plurality of cell strings CS1 to CSm may be connected to a plurality of bit lines BL1 to BLm, respectively, Each of the cell strings CS1 to CSm may include at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar that provides the channel layer may be provided in each cell string. In an embodiment, a pillar that provides at least one of the channel layer, the tunneling insulating film, the charge storage film, and the blocking insulating film may be provided in each cell string.

The source select transistor SST of each cell string may be connected between a common source line CSL and the memory cells MC1 to MCn.

The first to n-th memory cells MC1 to MCn of each cell string may be connected between the source select transistor SST and the drain select transistor DST.

The drain select transistor DST of each cell string may be connected between a corresponding bit line and the memory cells MC1 to MCn.

Memory cells that are connected to the same word line configure one page. The cell strings CS1 to CSm may be selected by selecting the drain select line DSL. One page among the selected cell strings may be selected by selecting one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

As shown in FIGS. 3 to 5, the memory cell array 110 of the semiconductor memory device 100 may be configured as a memory cell array of a three-dimensional structure. In addition, as shown in FIG. 6, the memory cell array 110 of the semiconductor memory device 100 may be configured as a memory cell array of a two-dimensional structure.

Figure 7:
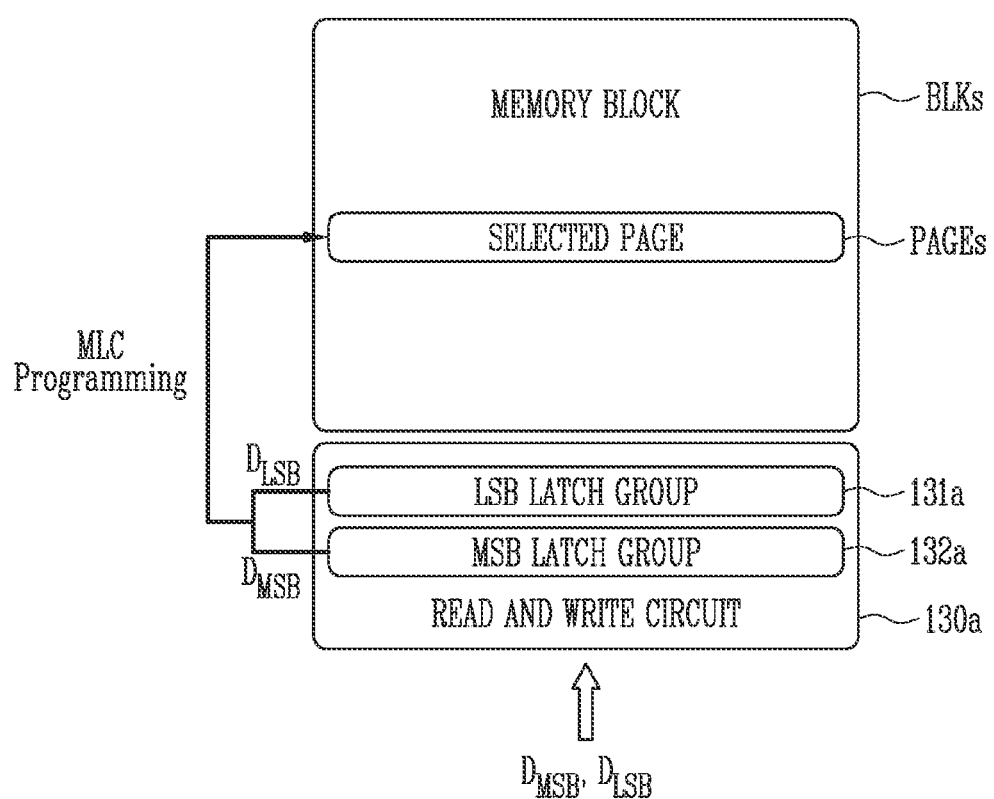
FIG. 7 is a block diagram illustrating a program operation of a semiconductor memory device according to an exemplary embodiment.

FIG. 7 is a block diagram illustrating a program operation of a semiconductor memory device according to an exemplary embodiment. Referring to FIG. 7, a selected memory block BLKs that becomes a target of the program operation and a read and write circuit 130a that is connected thereto are schematically shown. In FIG. 7, memory blocks, other than the selected memory block BLKs, are omitted for convenience of description. Referring to FIG. 7, the read and write circuit 130a may include an LSB latch group 131a and an MSB latch group 132a, The LSB latch group 131a may include a plurality of latches that respectively store bits that are included in LSB page data $D_{LSB}$. The MSB latch group 132a may include a plurality of latches that respectively store bits that are included in MSB page data $D_{MSB}$. For convenience of description, in FIG. 7, the read and write circuit 130a may include only the LSB latch group 131a and the MSB latch group 132a. However, the read and write circuit 130a may further include other latch groups, such as a sensing latch group, a main latch group, or a cache latch group in addition to the LSB latch group 131a and the MSB latch group 132a.

FIG. 7 shows a program operation of the MLC. For the MLC program operation, the read and write circuit 130a of the semiconductor memory device may receive the MSB page data $D_{MSB}$ and the LSB page data $D_{LSB}$. The LSB page data $D_{LSB}$ may be stored in the LSB latch group 131a. The MSB page data $D_{MSB}$ may be stored in the MSB latch group 132a.

Each of the LSB latch group 131a and the MSB latch group 132a may include data latches corresponding to the number of memory cells that are included in selected page PAGEs. Based on the LSB page data $D_{LSB}$ that is stored in the LSB latch group 131a and the MSB page data $D_{MSB}$ that is stored in the MSB latch group 132a, the MLC program operation on the selected page PAGEs among a plurality of pages that are included in the memory block BLKs may be performed. When the MLC program on the selected page PAGEs is completed, the LSB page data $D_{LSB}$ and the MSB page data $D_{MSB}$ may be stored in the selected page PAGEs.

Meanwhile, the LSB latch group 131a and the MSB latch group 132a may be required to maintain the LSB page data $D_{LSB}$ and the MSB page data $D_{MSB}$, respectively, while the MLC program operation on the selected page PAGES is performed. As described above, according to the embodiment shown in FIG. 7, in order to store the LSB page data $D_{LSB}$ and the MSB page data $D_{MSB}$ in the selected page PAGEs, the LSB latch group 131a and the MSB latch group 132a may be required to be included in the read and write circuit 130a. Accordingly, the number of latches that are included in the read and write circuit 130a may increase, which becomes a factor that leads to the increase in the area of the read and write circuit 130a and a peripheral circuit with the same.

In accordance with the semiconductor memory device and a method of operating the same according to an embodiment of the present disclosure, the LSB page data $D_{LSB}$ and the MSB page data $D_{MSB}$ that are received from the controller may be stored in a buffer page group that is inside the selected memory block. Thereafter, during the MLC program operation of the selected page, a verify operation may be performed by using the LSB page data $D_{LSB}$ and the MSB page data $D_{MSB}$ that are stored in the buffer page group. Accordingly, the LSB latch group and the MSB latch group might not be required to be included in the read and write circuit, and as a result, the area of the read and write circuit and the peripheral circuit with the same may be reduced.

Figure 8:
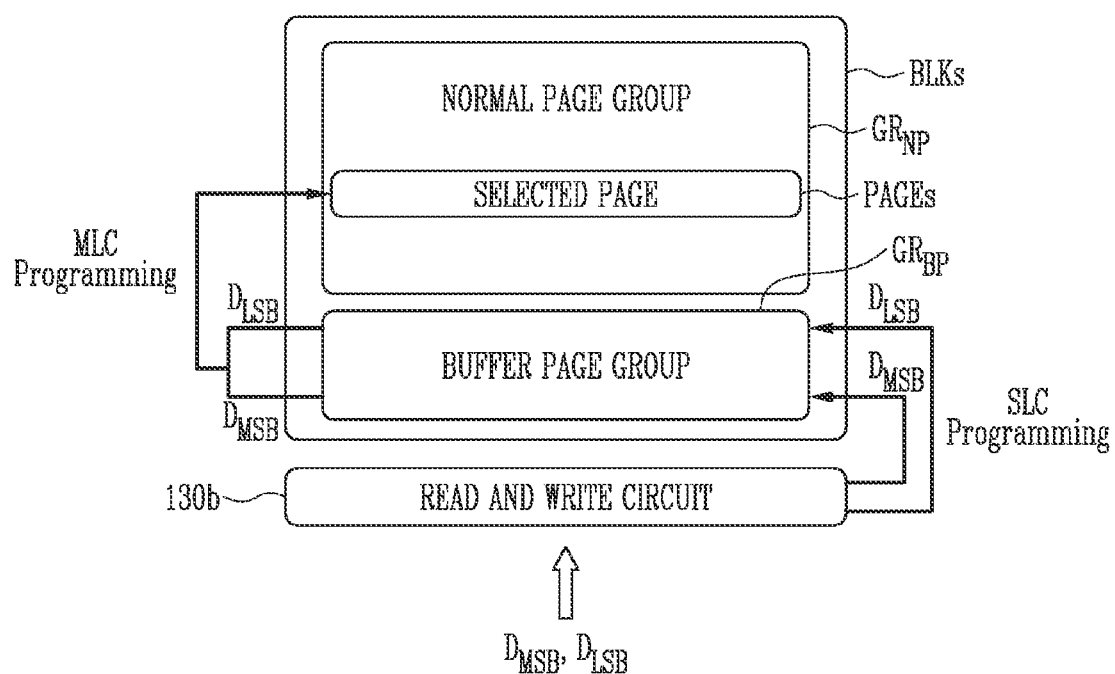
FIG. 8 is a block diagram illustrating a program operation of a semiconductor memory device according to an embodiment of the present disclosure.

FIG. 8 is a block diagram illustrating a program operation of a semiconductor memory device according to an embodiment of the present disclosure.

Referring to FIG. 8, the selected memory block BLKs may be divided into a normal page group $GR_{NP}$ and a buffer page group $GR_{BP}$. The buffer page group $GR_{BP}$ may include a plurality of buffer pages. The LSB page data $D_{LSB}$ may be stored in at least one of the plurality of buffer pages that are included in the buffer page group $GR_{BP}$ in an SLC program method. In addition, the MSB page data $D_{MSB}$ may be stored in at least one of the plurality of buffer pages that are included in the buffer page group $GR_{BP}$ in the SLC program method.

Meanwhile, the normal page group $GR_{NP}$ may include a plurality of normal pages. Data may be stored in the normal pages based on the MLC program operation. A read and write circuit 130b may perform the MLC program operation on a selected page among the normal page groups $GR_{NP}$ based on the LSB page data $D_{LSB}$ and the MSB page data $D_{MSB}$ that are stored in the buffer page group $GR_{BP}$ in the SLC program method. Accordingly, the LSB latch group and the MSB latch group might not be required to be included in the read and write circuit 130b, and as a result, the area of the read and write circuit 130b and the peripheral circuit with the same may be reduced.

Figure 9:
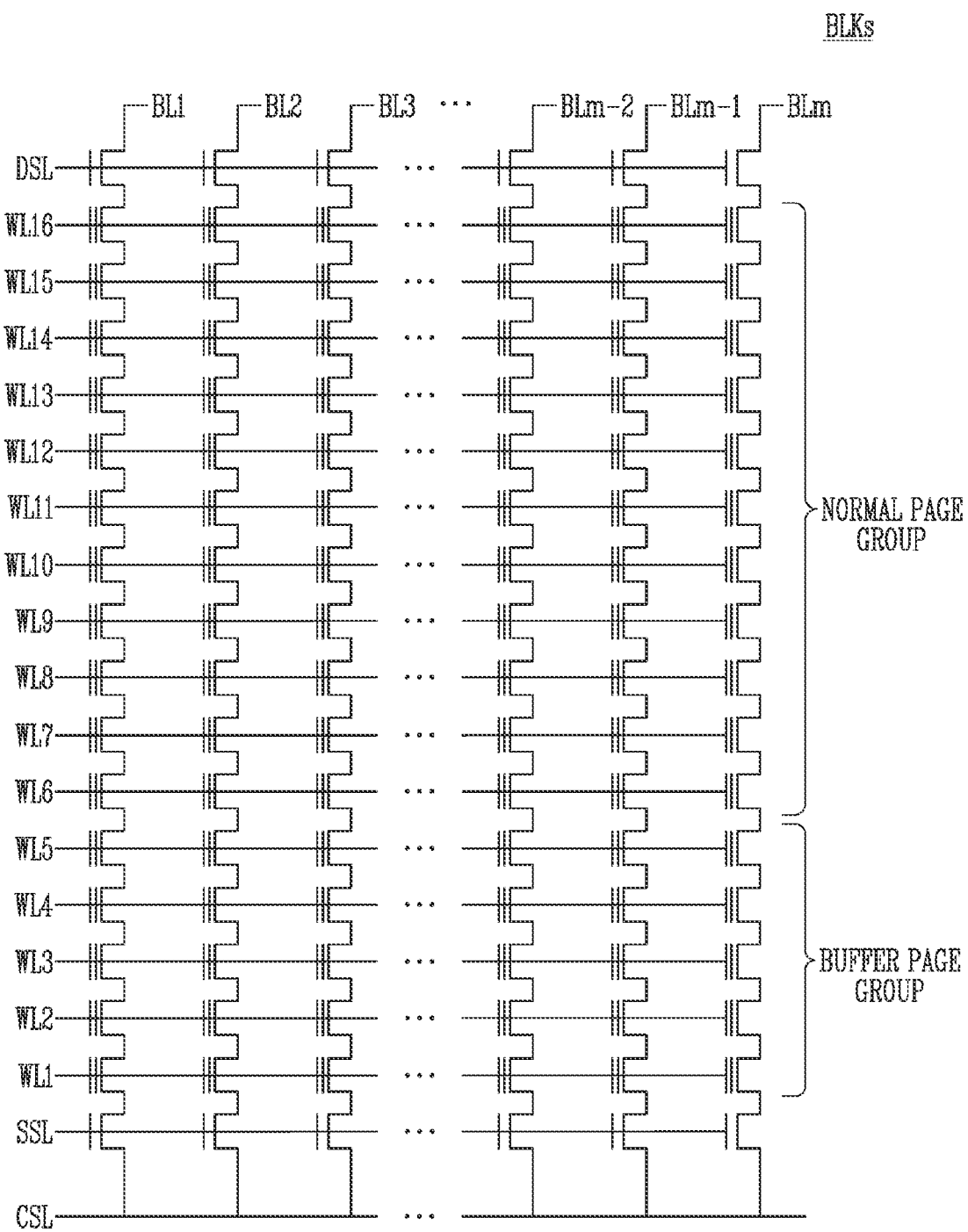
FIG. 9 is a circuit diagram illustrating a structure of a memory block for performing a program operation of a semiconductor memory device according to an embodiment of the present disclosure.

FIG. 9 is a circuit diagram illustrating a structure of a memory block for performing a program operation of a semiconductor memory device according to an embodiment of the present disclosure.

Referring to FIG. 9, a structure of a memory block with a plurality of memory cells is shown. The memory block shown in FIG. 9 is substantially the same as the memory block BLKc shown in FIG. 6. In FIG. 9, an embodiment in which one cell string includes 16 memory cells is shown. However, this is an example, and the memory block may be configured so that various other numbers of memory cells are included in one cell string.

Referring to FIG. 9, pages with memory cells that are connected to first to fifth word lines WL1 to WL5 may be included in the buffer page group, and pages with memory cells that are connected to sixth to sixteenth word lines WL6 to WL16 may be included in the normal page group. A configuration of the plurality of buffer pages that are included in the buffer page group will be described later with reference to FIG. 10.

FIG. 10 is a block diagram schematically illustrating a structure of a memory block for performing a program operation of a semiconductor memory device according to an embodiment of the present disclosure.

Referring to FIG. 10, the memory block may include first to n-th pages. The first to n-th pages may be connected to the first to n-th word lines WL1 to WLn, respectively. In a case where N is 16, the first to n-th word lines WL1 to WLn may correspond to the first to sixteenth word lines WL1 to WL16 shown in FIG. 9.

The buffer page group may include a verify (VFY) buffer page, an LSB buffer page, an MSB buffer page, an inversion LSB (LSB_N) buffer page, and an inversion MSB (MSB_N) buffer page. The verify buffer page may be connected to the fifth word line WL5. The LSB buffer page may be connected to the fourth word line WL4. The MSB buffer page may be connected to the third word line WL3. The inversion LSB (LSB_N) buffer page may be connected to the second word line WL2, The inversion MSB (MSB_N) buffer page may be connected to the first word line WL1. However, this is an example, and the verify buffer page, the LSB buffer page, the MSB buffer page, the inversion LSB (LSB_N) buffer page, and the inversion MSB (MSB_N) buffer pages may be connected to any word lines among the first to n-th word lines WL1 to WLn, respectively. In this case, the remaining word lines to which the verify buffer page, the LSB buffer page, the MSB buffer page, the inversion LSB (LSB_N) buffer page, and the inversion MSB (MSB_N) buffer page might not be connected may be connected to the normal page.

In an example of FIG. 10, the normal page may be connected to the sixth word line WL6 to the n-th word line WLn, Meanwhile, the selected page may be connected to an s-th word line WLs among the sixth word line WL6 to the n-th word line WLn. Accordingly, sixth to (s−1)-th word lines WL6 to WLs−1 and an (s+1)-th to n-th word lines WLs+1 to WLn may be connected to an unselected page.

When the read and write circuit 30b receives the LSB page data $D_{LSB}$, the read and write circuit 130b may perform the SLC program on the LSB page data $D_{LSB}$ in the LSB buffer page. Meanwhile, the read and write circuit 130b may perform the SLC program on inverted LSB page data $\overline{D_{LSB}}$ in the inversion LSB (LSB_N) buffer page.

In addition, when the read and write circuit 130b receives the MSB page data $D_{MSB}$, the read and write circuit 130b may perform the SLC program on the MSB page data $D_{MSB}$ in the MSB buffer page. Meanwhile, the read and write circuit 130b may perform the SLC program on inverted MSB page data $\overline{D_{MSB}}$ in the inversion MSB (MSB_N) buffer page.

Meanwhile, the verify (VFY) buffer page may store verify result data indicating whether the memory cells that are included in the selected page is programmed to a target program state. At the beginning of the program operation, each of the memory cells that are included in the verify (VFY) buffer page may store data of the erase state, that is, data of 1. As a program process proceeds, when the program of the memory cells that are included in the selected page is completed to the target program state, the SLC program may be performed on the memory cells of the verify buffer page corresponding thereto, and the memory cells may be updated to store data of 0. The read and write circuit 130b may control a bit line voltage so that the memory cells that are programmed to the target program state are no longer programmed based on the data that is stored in the verify buffer page.

FIG. 11A is a table illustrating an exemplary embodiment of a logic code for programming an MLC. FIG. 11A is an exemplary diagram of the logic code for the MLC program. However, this is an example, and various other logic codes for the MLC program may also be used.

Figure 11B:
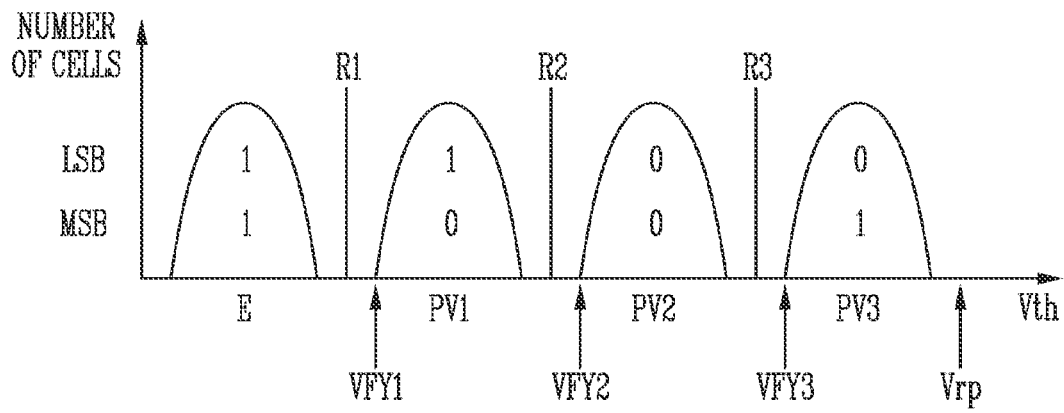
FIG. 11B is a graph illustrating a threshold voltage distribution of memory cells programmed according to the logic code shown in FIG. 11A.

FIG. 11B is a graph illustrating a threshold voltage distribution of memory cells programmed based on the logic code, shown in FIG. 11A. In FIG. 11B, a horizontal axis indicates a threshold voltage Vth of the memory cells, and a vertical axis indicates the number of memory cells corresponding to each threshold voltage.

Referring to FIG. 11B, when data is stored in the selected page based on the logic code, shown in FIG. 11A, a threshold voltage state of the memory cells that are included in the selected page is shown. Among the memory cells that are included in the selected page, a memory cell of which an LSB is 1 and an MSB is 1 maintains the erase state E. Among the memory cells that are included in the selected page, a memory cell of which the LSB is 1 and the MSB is 0 is programmed to a first program state PV1. A first verify voltage VFY1 may be used to verify whether the memory cell of which the LSB 1 and the MSB is 0 is programmed to the first program state PV1. Among the memory cells that are included in the selected page, a memory cell of which the LSB is 0 and the MSB is 0 is programmed to a second program state PV2. A second verify voltage VFY2 may be used to verify whether the memory cell of which the LSB is 0 and the MSB is 0 is programmed to the second program state PV2. Among the memory cells that are included in the selected page, a memory cell of which the LSB is 0 and the MSB is 1 may be programmed to a third program state PV3. A third verify voltage VFY3 may be used to verify whether the memory cell of which the LSB is 0 and the MSB is 1 is programmed to the third program state PV3.

After the program for the selected page is completed, first to third read voltages R1 to R3 may be used during a read operation for the selected page. In this case, a read pass voltage Vrp may be applied to word lines that are connected to the unselected page.

Figure 12:
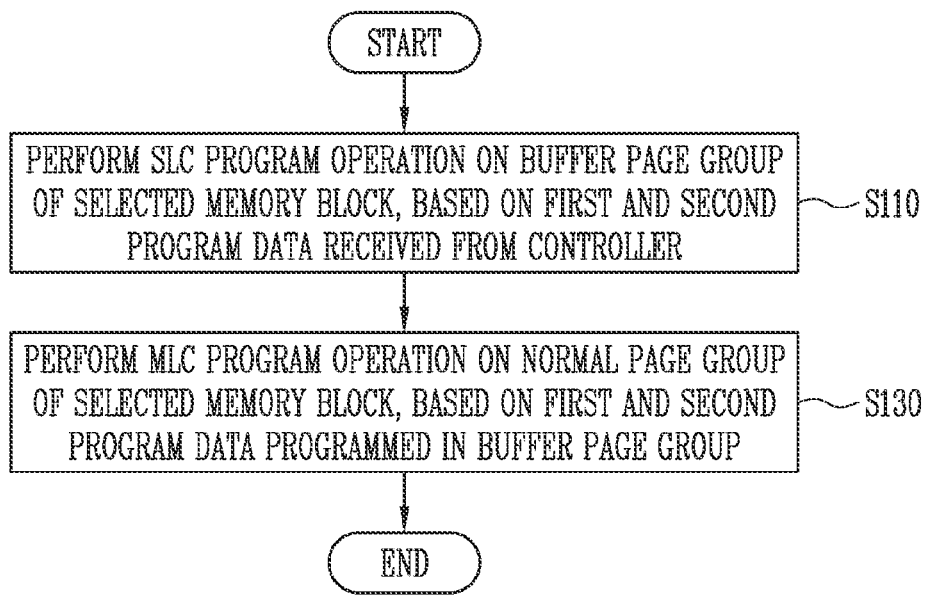
FIG. 12 is a flowchart illustrating a method of operating a semiconductor memory device according to an embodiment of the present disclosure.

FIG. 12 is a flowchart illustrating a method of operating a semiconductor memory device according to an embodiment of the present disclosure.

Referring to FIG. 12, the MLC program operation on the selected page may be performed based on the method of operating the semiconductor memory device according to an embodiment of the present disclosure. The method of operating the semiconductor memory device according to an embodiment of the present disclosure may include performing the SLC program operation on the buffer page group of the selected memory block based on first and second program data that are received from the controller (S110) and performing the MLC program operation on the normal page group of the selected memory block based on the first and second program data that are programmed in the buffer page group (S130).

In step S110, the SLC program operation, shown in FIG. 8, may be performed. In an embodiment, the first program data of step S110 may be the LSB page data, and the second program data may be the MSB page data. In another embodiment, the first program data of step S110 may be the MSB page data, and the second program data may be the LSB page data. The step S110 is described in more detail with reference to FIGS. 13, 14A, and 14B.

In step S130, the MLC program operation, shown in FIG. 8, may be performed. In this case, the read and write circuit 130b might not use the first and second program data that is stored in a separate latch circuit, but may use the first and second program data that are programmed in the buffer page group in step S110 to perform the MLC program operation on the selected page that is included in the normal page group. Step S130 is described in more detail with reference to FIGS. 15A to 22B.

FIG. 13 is a flowchart illustrating an exemplary embodiment of step S110 of FIG. 12.

Referring to FIG. 13, step S110 may include receiving the first program data from the controller (S210), programming at least one buffer page included in the buffer page group based on the first program data (S230), receiving second program data from the controller (S250), and programming at least one buffer page included in the buffer page group based on the second program data (S270).

According to an embodiment of the present disclosure, the read and write circuit 130b might not program corresponding data after receiving both of the first program data and the second program data. In other words after receiving the first program data, the read and write circuit 130b may immediately program the first program data in the buffer page group. Then, after receiving the second program data, the read and write circuit 130b may immediately program the second program data in the buffer page group. Therefore, the number of latches that are required in the read and write circuit 130b may be minimized.

Figure 14A:
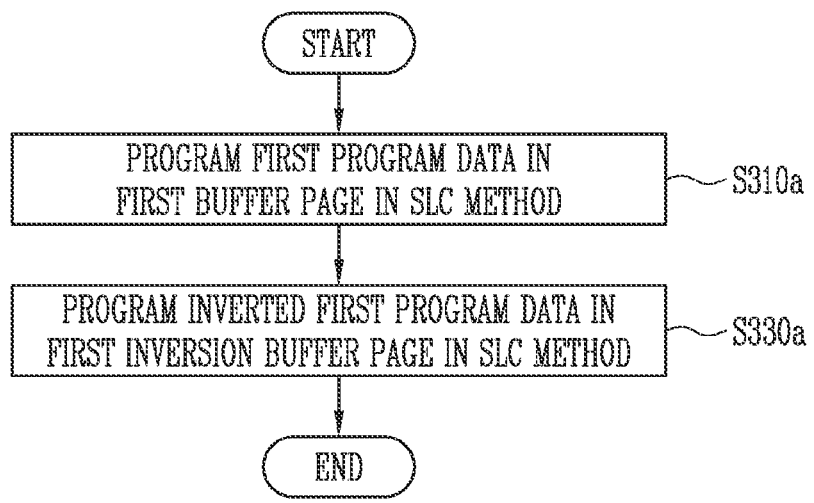
FIG. 14A is a flowchart illustrating an exemplary embodiment of step S230 of FIG. 13. Meanwhile.

FIG. 14A is a flowchart illustrating an exemplary embodiment of step S230 of FIG. 13. Meanwhile, FIG. 146 is a flowchart illustrating an exemplary embodiment of step S270 of FIG. 13.

Referring to FIG. 14A, step S230 of FIG. 13 may include programming the first program data in the first buffer page in the SLC method (S310a) and programming the inverted first program data in a first inversion buffer page in the SLC method (S330a).

When the first program data is the LSB page data, in step S310a, the LSB page data may be programmed in the LSB buffer page, shown in FIG. 10, in the SLC method. In this case, the verify operation may be omitted according to an embodiment, and the LSB page data may be programmed in the LSB buffer page by applying a program pulse to the fourth word line WL4 at least once. In this case, the first buffer page may be the LSB buffer page of FIG. 10.

Meanwhile, when the first program data is the LSB page data, in step S330a, the LSB page data may be inverted, and the inverted LSB page data $\overline{D_{LSB}}$ may be programmed in the inversion LSB (LSB_N) buffer page, shown in FIG. 10. In this case, the first inversion buffer page may be the inversion LSB (LSB_N) buffer page of FIG. 10. The inversion operation of the LSB page data may be performed by inverting each of a plurality of bits that is included in the LSB page.

Figure 14B:
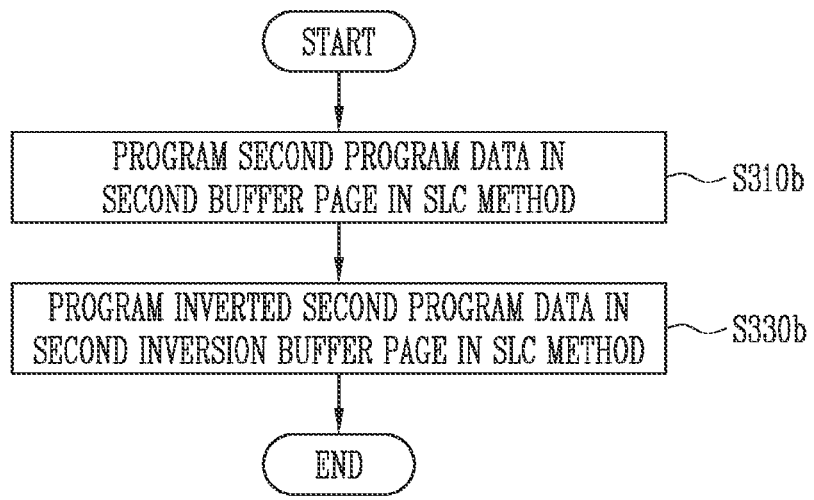
FIG. 14B is a flowchart illustrating an exemplary embodiment of step S270 of FIG. 13.

Referring to FIG. 14B, step S270 of FIG. 13 may include programming the second program data in the second buffer page in the SLC method (S310b) and programming the inverted second program data in a second inversion buffer page in the SLC method (S330b).

When the second program data is the MSB page data, in step S310b, the MSB page data may be programmed in the MSB buffer page, shown in FIG. 10, in the SLC method. In this case, the verify operation may be omitted according to an embodiment, and the MSB page data may be programmed in the MSB buffer page by applying a program pulse to the third word line WL3 at least once. In this case, the second buffer page may be the MSB buffer page of FIG. 10.

Meanwhile, when the second program data is the MSB page data, in step S330b, the MSB page data may be inverted, and the inverted MSB page data $\overline{D_{MSB}}$ may be programmed in the inversion MSB (MSB_N) buffer page, shown in FIG. 10. In this case, the second inversion buffer page may be the inversion MSB (MSB_N) buffer page of FIG. 10. The inversion operation of the MSB page data may be performed by inverting each of a plurality of bits included in the MSB page.

Figures 15A, 15B:
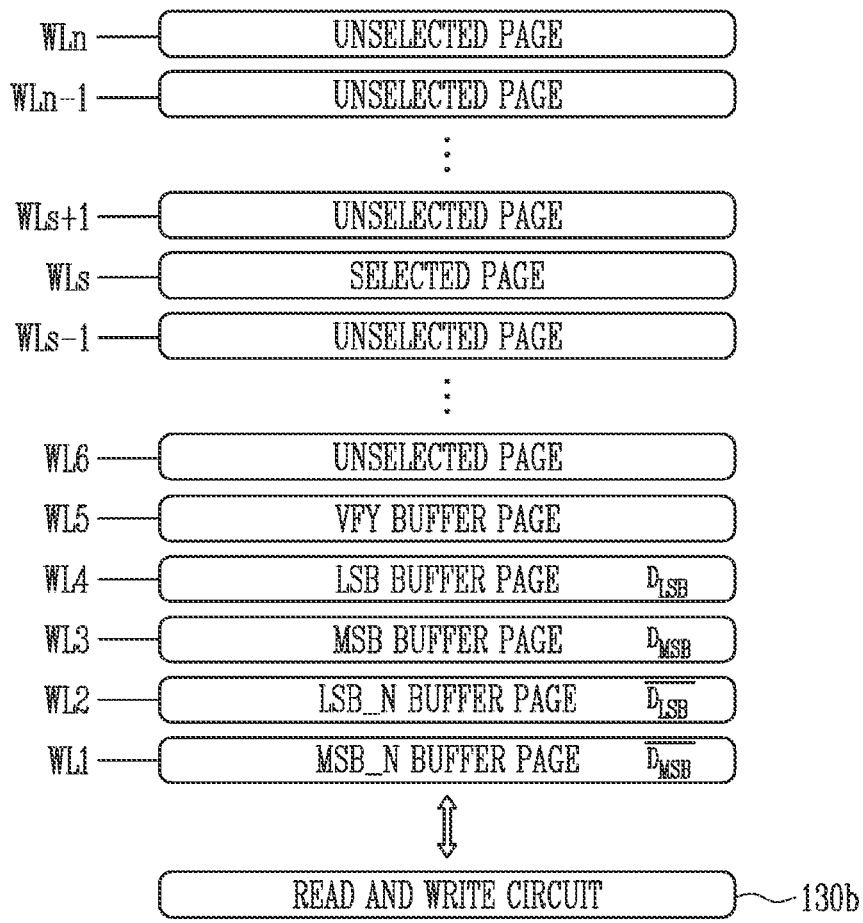
FIG. 15A is a block diagram illustrating a method of performing an SLC program operation on a buffer page group based on first and second program data according to an embodiment of the present disclosure.
FIG. 15B is a table illustrating an exemplary embodiment of data to be programmed in a buffer page group and a logic code for the program operation in FIG. 15A.

FIG. 15A is a block diagram illustrating a method of performing an SLC program operation on a buffer page group based on first and second program data according to an embodiment of the present disclosure.

FIG. 15B is a table illustrating an exemplary embodiment of data to be programmed in a buffer page group and a logic code for the program operation in FIG. 15A.

Referring to FIG. 15A, the LSB page data $D_{LSB}$ may be programmed in the LSB buffer page in the SLC method through step S310a of FIG. 14A, and the LSB page data $\overline{D_{LSB}}$ that is inverted through step S330a of FIG. 14A may be programmed in the inversion LSB (LSB_N) buffer page in the SLC method. Meanwhile, referring to FIG. 15A, the MSB page data $D_{MSB}$ may be programmed in the MSB buffer page in the SLC method through step S310b of FIG. 14B, and the MSB page data $\overline{D_{MSB}}$ that is inverted through step S330b of FIG. 14B may be programmed in in the inversion MSB (MSB_N) buffer page in the SLC method.

Referring to FIG. 15B, a program state of a memory cell based on bit data of LSB, MSB, inverted LSB (LSB_N), and inverted MSB (MSB_N) is shown as a table.

Figure 16:
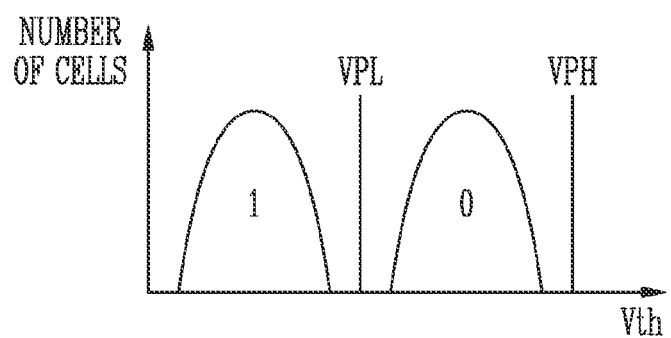
FIG. 16 is a graph illustrating a threshold voltage distribution of memory cells programmed by an SLC program operation.

FIG. 16 is a graph illustrating a threshold voltage distribution of memory cells programmed by an SLC program operation.

Referring to FIG. 16, the memory cells may have a threshold voltage state of one of an erase state that indicates bit "I" or a program state that indicates bit "0" based on the SLC program operation. When a low pass voltage VPL is applied to the word line that is connected to the memory cells on which the SCL program is performed, the memory cells with the threshold voltage of the erase state may be turned on and the memory cells with the threshold voltage of the program state may be turned off. Meanwhile, when a high pass voltage VPH is applied to the word line that is connected to the memory cells on which the SLC program is performed, all memory cells that are connected to the corresponding word line may be turned on, regardless of the threshold voltage state of the memory cells. Using such a feature, by selectively applying the low pass voltage VPL or the high pass voltage VPH to the word lines that are connected to the LSB buffer page, the MSB buffer page, the inversion LSB (LSB_N) buffer page, and the inversion MSB (MSB_N) buffer page, respectively, the MLC program operation may be performed.

FIG. 17 is a flowchart illustrating an exemplary embodiment of step S130 of FIG. 12.

Step S130 of FIG. 12, that is, the MLC program operation may include a plurality of program loops. Each of the plurality of program loops may include a program step and a verify step. When all memory cells are programmed to a target state by repeating the program loop, step S130 may be ended. FIG. 17 is a flowchart exemplarily illustrating one program loop among the plurality of program loops. In FIG. 17, steps S410 and S420 may be included in the program step, and steps S430 to S470 may be included in the verify step.

In step S410, based on the data that is stored in the verify buffer page, a plurality of bit line voltages for the programming of the selected page may be set. In the verify buffer page, data that is related to the memory cells of which the program may be completed is stored. Therefore, a program inhibition voltage may be applied to the bit line that is connected to the memory cell of which the program is completed, and a program permission voltage may be applied to the bit line that is connected to the memory cell of which the program is not completed.

In step S420, the program pass voltage Vpp may be applied to the word line that is connected to the unselected page, and the program voltage VPGM may be applied to the word line that is connected to the selected page. Through step S420, the threshold voltage of the memory cells of which the program is not completed increases.

Thereafter, in step S430, based on the data that is stored in the first and second buffer pages and the first and second inversion buffer pages, the program incomplete cell information that is related to the target program state may be loaded in the sensing latch that is inside the read and write circuit. Accordingly, information on the memory cell of which the program is not completed among memory cells to be programmed to the target program state, for example, the first program state PV1, may be loaded in the sensing latch of the read and write circuit.

In step S450, the verify voltage corresponding to the target program state may be applied to the word line that is connected to the selected page, and the read pass voltage Vrp may be applied to the word line that is connected to the unselected page. When the target program state is the first program state PV1, the first verify voltage VFY1 may be applied to the word line that is connected to the selected page in step S450. The read pass voltage may be applied to the remaining word lines, and thus, the threshold voltage of the memory cells to be programmed to the first program state PV1 among the memory cells that are included in the selected page may be sensed.

In step S460, the plurality of bit line voltages for the program of the verify buffer page may be set based on a verify result of step S450. For example, the program inhibition voltage may be required to be applied to the bit line that is connected to the memory cell of which the threshold voltage is higher than the first verify voltage VFY1 among the memory cells to be programmed to the first program state PV1 in a subsequent program loop. Therefore, in order to update the verify result to the verify buffer page, the bit line voltage may be set.

In step S470, the program pass voltage may be applied to the word line that is connected to the remaining pages, except for the verify buffer page, and the program voltage may be applied to the word line that is connected to the verify buffer page. The threshold voltage state of the memory cells that are included in the verify buffer page may be updated by step S470. For example, among the memory cells to be programmed to the first program state PV1, the threshold voltage of the memory cells of the verify buffer page may correspond to the memory cells of which the program is not completed before step S420, and the threshold voltage may increase and thus, the program may be completed to the first program state PV1 according to step S420, which increases based on step S470. As performance of step S470 is completed, one program loop may be completed. When verification for all program states PV1 to PV3 is passed after the performance of step S470, the entire program operation may be ended. When verification of at least one program state among all program states PV1 to PV3 is not passed after performance step S470, the method returns to step S410 and a subsequent program loop may be performed.

Hereinafter, steps shown in FIG. 17 are described in more detail with reference to FIGS. 18A to 22A.

Figures 18A, 18B:
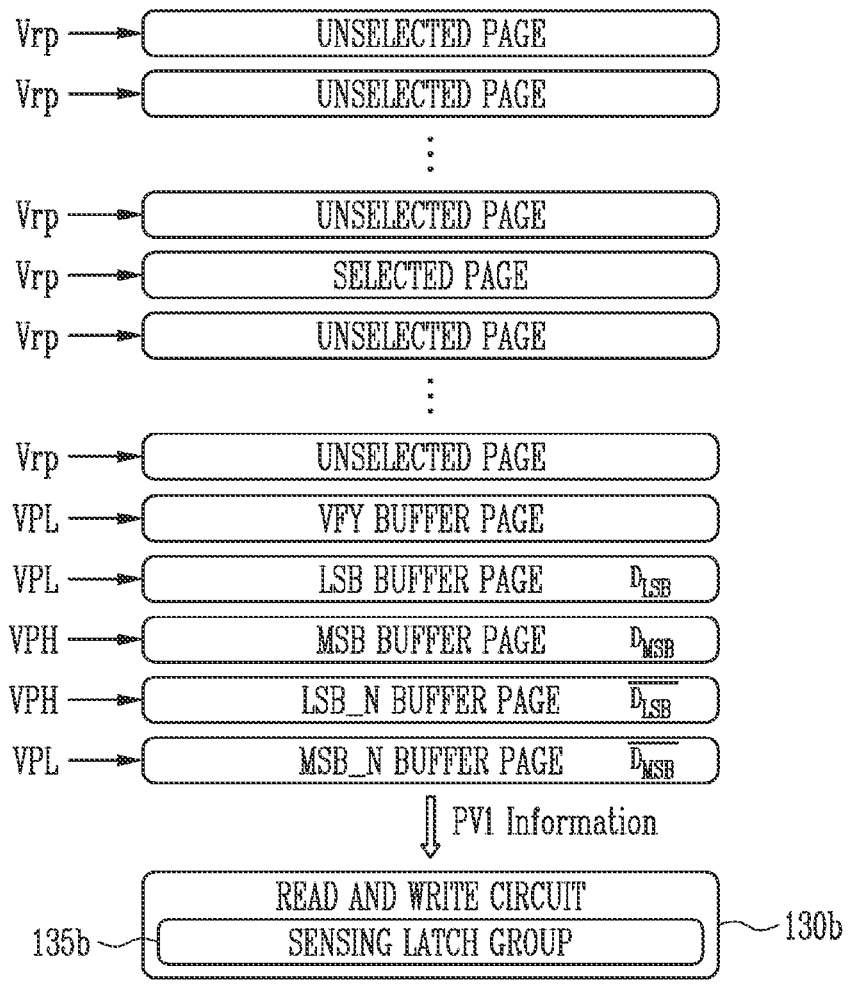
FIG. 18A is a block diagram illustrating a step of loading program incomplete cell information related to a first program state PV1 by step S430 of FIG. 17.
FIG. 18B is a table illustrating a step of loading the program incomplete cell information related to the first program state PV1 according to step S430 of FIG. 17.

FIG. 18A is a block diagram illustrating a step of loading program incomplete cell information that is related to the first program state PV1 by step S430 of FIG. 17. FIG. 18B is a table illustrating a step of loading the program incomplete cell information that is related to the first program state PV1 according to step S430 of FIG. 17. Hereinafter, the description is given with reference to FIGS. 17, 18A, and 18B together.

Referring to FIG. 18A, the read pass voltage Vrp may be applied to the word line that is connected to the pages that are included in the normal page group. Accordingly, all memory cells that are included in the normal page group may be turned on.

In addition, the low pass voltage VPL may be applied to the word line that is connected to the verify buffer page, and the low pass voltage VPL may be applied to the word line that is connected to the LSB buffer page. Accordingly, among the memory cells that are included in the verify buffer page and the LSB buffer page, the memory cells of the erase state may be turned on, and the memory cells of the program state may be turned off.

Meanwhile, the high pass voltage VPH may be applied to the word line that is connected to the MSB buffer page and the inversion LSB (LSB_N) buffer page. Accordingly, all memory cells that are included in the MSB buffer page and the inversion LSB (LSB_N) buffer page may be turned on regardless of the threshold voltages each of the memory cells that are included in the MSB buffer page and the inversion LSB (LSB_N) buffer page.

Meanwhile, the low pass voltage VPL may be applied to the word line that is connected to the inversion MSB (MSB_N) buffer page. Accordingly, among the memory cells that are included in the inversion MSB (MSB_N) buffer page, the memory cells of the erase state may be turned on and the memory cells of the program state may be turned off.

In summary, all memory cells that are included in the pages except for the verify buffer page, the LSB buffer page, and the inversion MSB buffer page may be turned on. Therefore, PV1 information that is transferred to the sensing latch group 135b of the read and write circuit 130b through the bit lines may be determined by a combination of data that is stored in the verify buffer page, the LSB buffer page, and the inversion MSB buffer page, respectively. More specifically, the PV1 information may be generated by performing an AND operation in a bit unit on the data that is stored in the verify buffer page, the LSB buffer page, and the inversion MSB buffer page, respectively.

Referring to FIG. 18B, a table illustrating a result of the AND operation in a bit unit on the data that is stored in the LSB buffer page and the inversion MSB buffer page, respectively, is shown. In the table of FIG. 18B, since all cells that are included in the MSB buffer page and the inversion LSB (LSB_N) buffer page are turned on, corresponding page data is omitted for convenience.

The memory cells that store a bit of 1 among the memory cells that are included in the LSB buffer page may be turned on. Referring to FIG. 18B, the memory cells that store the bit of 1 among the memory cells that are included in the LSB buffer page may correspond to each of the memory cells to be programmed to the erase state E and the first program state PV1 among the memory cells that are included in the selected page.

Meanwhile, the memory cells that store the bit of 1 among the memory cells that are included in the inversion MSB buffer page may be turned on, Referring to FIG. 18B, the memory cells that store the bit of 1 among the memory cells that are included in the inversion MSB buffer page may correspond to the first program state PV1 and the second program state PV2.

Therefore, when the AND operation is performed on the data respectively stored in the LSB buffer page and the inversion MSB buffer page in the bit unit, the bit line that is connected to the memory cells corresponding to the first program state PV1 may be selected.

The process in which an AND operation is additionally performed on the data that is stored in the verify buffer page and the above-described result may be considered. When the AND operation is performed on the data that is stored in the LSB buffer page, the inversion MSB buffer page, and the verify buffer page in the bit unit, among the memory cells corresponding to the first program state PV1, the bit line of which the program operation is not completed may be selected.

As a result, the PV1 information may be information that indicates the memory cell of which the program is not yet completed among the memory cells to be programmed to the first program state PV1. Specifically, among the bit lines that are connected to the read and write circuit 130b, a signal of a relatively high voltage may be transferred to the bit line that is connected to the memory cell, among the memory cells to be programmed to the first program state PV1, of which the program is not yet completed and a signal of a relatively low voltage may be transferred to the remaining bit lines. A set of such bit line signals may be the PV1 information. The PV1 information may be stored in the sensing latch group 135b of the read and write circuit 130b. The PV1 information that is stored in the sensing latch group 135b may be used for a PV1 verify operation thereafter.

Figure 19:
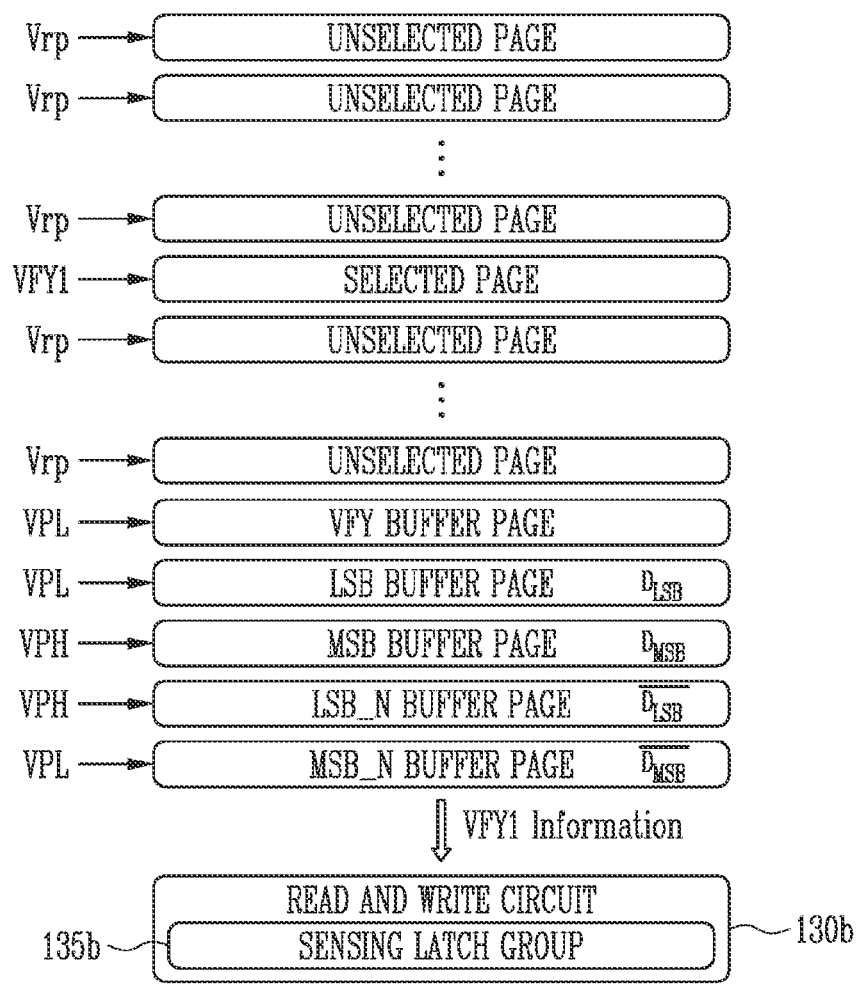
FIG. 19 is a block diagram illustrating step S450 of FIG. 17.

FIG. 19 is a block diagram illustrating step S450 of FIG. 17.

Referring to FIG. 19, the read pass voltage Vrp may be applied to the word line that is connected to the unselected page among the pages that are included in the normal page group, and the first verify voltage VFY1 may be applied to the word line that is connected to the selected page, Meanwhile, a voltage condition of the word line that is connected to the pages that are included in the buffer page group may be the same as FIG. 18.

Therefore, among the memory cells to be programmed to the first program state PV1 in the selected page, first verify information (VFY1 information), which is information on the memory cells with a threshold voltage that is higher than the first verify voltage VFY1, may be transferred to the read and write circuit 130b. In an embodiment, the first verify information may be stored in the sensing latch group 135b that is inside the read and write circuit 130b. In another embodiment, the first verify information may be stored in a latch group other than the sensing latch group 135b.

Figure 20:
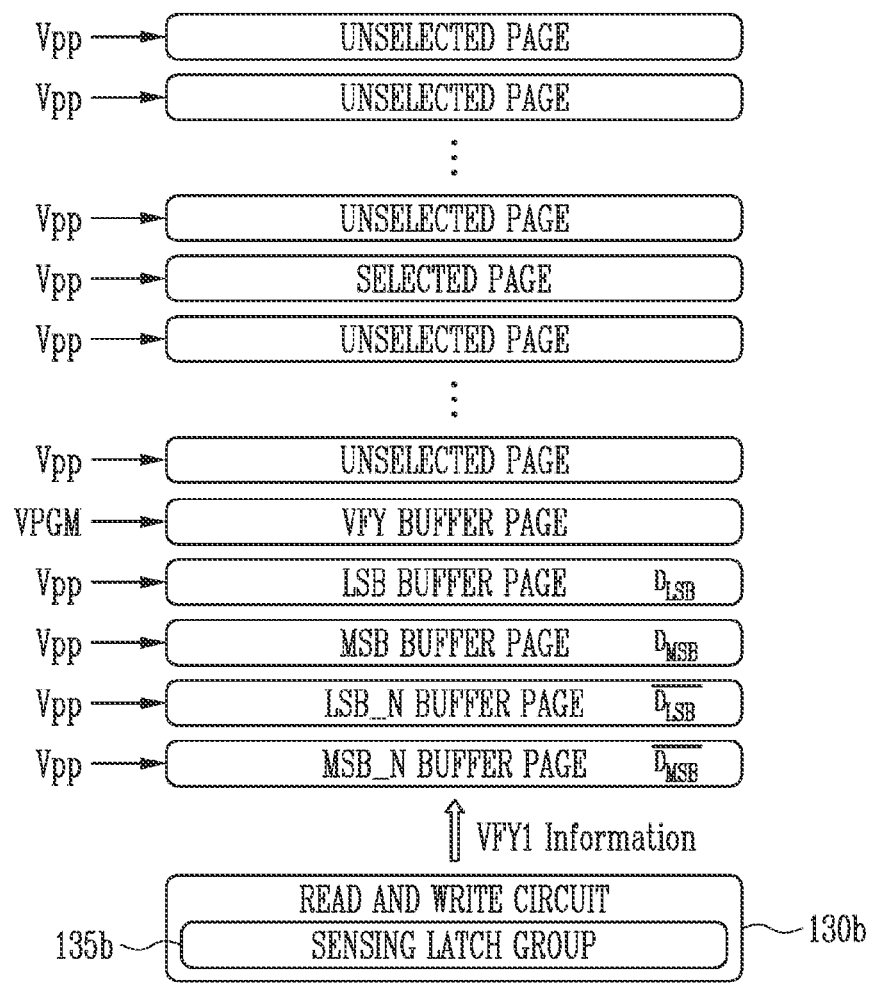
FIG. 20 is a block diagram illustrating steps S460 and S470 of FIG. 17.

FIG. 20 is a block diagram illustrating steps S460 and S470 of FIG. 17.

Referring to FIG. 20, the program pass voltage Vpp may be applied to the word line that is connected to the pages that are included in the normal page group. Meanwhile, the program pass voltage Vpp may be applied to the word line that is connected to the pages, except for the verify buffer page among the pages that are included in the buffer page group. The program voltage VPGM may be applied to the word line that is connected to the verify buffer page.

At this time, the read and write circuit 130b may set the bit line voltage based on the first verify information (VFY1 information) that is received in step S450. Accordingly, the program permission voltage may be applied to the bit line that is connected to the memory cells of which the program is completed among the memory cells to be programmed to the first program state PV1. The program inhibition voltage may be applied to the remaining bit lines. Since the program voltage VPGM is applied to the word line that is connected to the verify buffer page in a state in which the bit line voltage is set as described above, data in which the threshold voltage state of the memory cells to be programmed to first program state PV1 is updated may be programmed in the verify buffer page. The data programmed in the verify buffer page may be used in step S410 of a subsequent program loop.

Figures 21A, 21B:
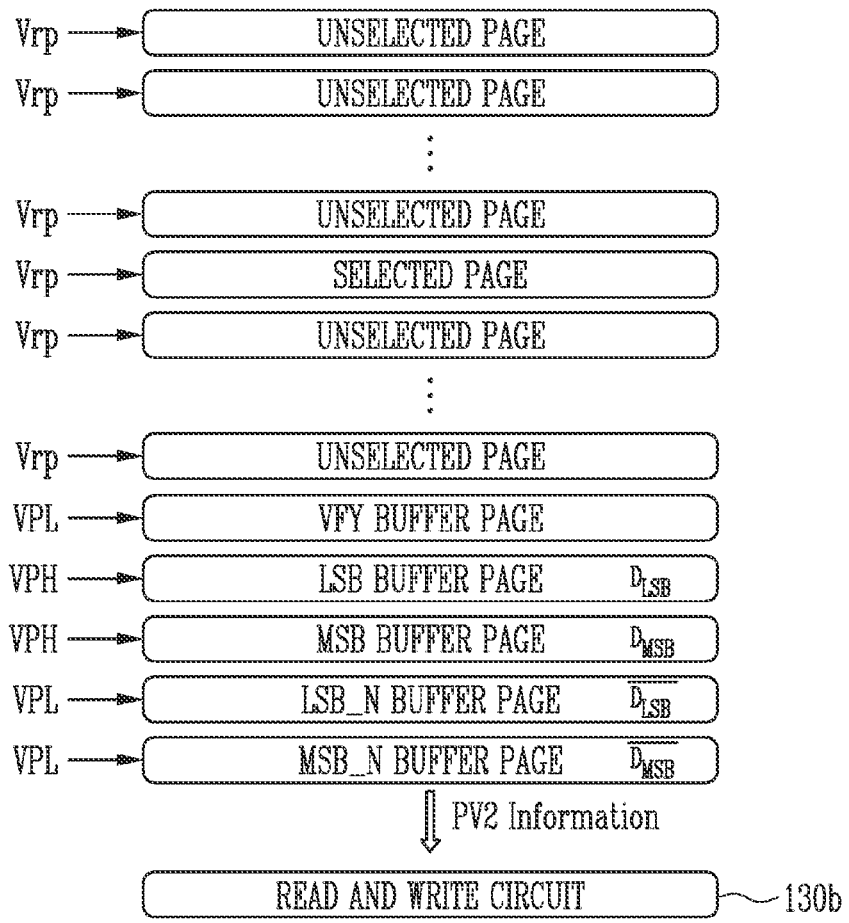
FIG. 21A is a block diagram illustrating a step of loading program incomplete cell information related to a second program state PV2 by step S430 of FIG. 17.
FIG. 21B is a table illustrating a step of loading the program incomplete cell information related to the second program state PV2 according to step S430 of FIG. 17.

FIG. 21A is a block diagram Illustrating a step of loading program incomplete cell information related to the second program state PV2 by step S430 of FIG. 17, FIG. 21B is a table illustrating a step of loading the program incomplete cell information related to the second program state PV2 according to step S430 of FIG. 17.

Referring to FIGS. 18A and 18B, the step of loading the program incomplete cell information related to the first program state PV1 is described. An operation similar thereto may be performed to load the program incomplete cell Information that is related to the second program state PV2.

Referring to FIG. 21A, the read pass voltage Vrp may be applied to the word line that is connected to the pages that are included in the normal page group. Accordingly, all memory cells that are included in the normal page group may be turned on.

In addition, the low pass voltage VPL may be applied to the word line that is connected to the verify buffer page, and the high pass voltage HPL may be applied to the word line that is connected to the LSB buffer page and the HSB buffer page. Accordingly, among the memory cells that are included in the verify buffer page, the memory cells of the erase state may be turned on and the memory cells of the program state are turned off. In addition, all memory cells that are included in the LSB buffer page and the MSB buffer page may be turned on.

Meanwhile, the low pass voltage VPL may be applied to the word line that is connected to the inversion LSB (LSB_N) buffer page and the inversion MSB (MSB_N) buffer page. Accordingly, among the memory cells that are included in the inversion LSB (LSB_N) buffer page and the inversion MSB (MSB_N) buffer page, the memory cells of the erase state may be turned on and the memory cells of the program state may be turned off.

In summary, all memory cells that are included in the pages, except for the verify buffer page, the inversion LSB buffer page, and the inversion MSB buffer page may be turned on, Therefore, PV2 information that is transferred to the sensing latch group 135b of the read and write circuit 130b through the bit lines may be determined by a combination of data that is stored in the verify buffer page, the inversion LSB buffer page, and the inversion MSB buffer page, respectively. More specifically, the PV2 information may be generated by performing an AND operation in a bit unit on the data that is stored in the verify buffer page, the inversion LSB buffer page, and the inversion MSB buffer page, respectively.

Referring to FIG. 21B, a table illustrating a result of the AND operation in a bit unit on the data that is stored in the inversion LSB buffer page and the inversion MSB buffer page, respectively, is shown. Similarly to FIG. 18B, when the AND operation is performed on the data respectively stored in the inversion LSB buffer page and the inversion MSB buffer page in the bit unit, the bit line that is connected to the memory cells corresponding to the second program state PV2 may be selected.

A process in which an AND operation is additionally performed on the data that is stored in the verify buffer page and the above-described result may be considered. When the AND operation is performed on the data that is stored in the inversion LSB buffer page, the inversion MSB buffer page, and the verify buffer page in the bit unit, among the memory cells corresponding to the second program state PV2, the bit line of which the program operation is not completed may be selected.

As a result, the PV2 information may be information that indicates the memory cell of which the program is not yet completed among the memory cells to be programmed to the second program state PV2. Specifically, among the bit lines that are connected to the read and write circuit 130b, a signal of a relatively high voltage may be transferred to the bit line that is connected to the memory cell, among the memory cells to be programmed to the second program state PV2, of which the program is not yet completed and a signal of a relatively low voltage may be transferred to the remaining bit lines. A set of such bit line signals may be the PV2 information. The PV2 information may be stored in the sensing latch group 135b of the read and write circuit 130b. The PV2 information that is stored in the sensing latch group 135b may be used for a PV2 verify operation thereafter.

Figures 22A, 22B:
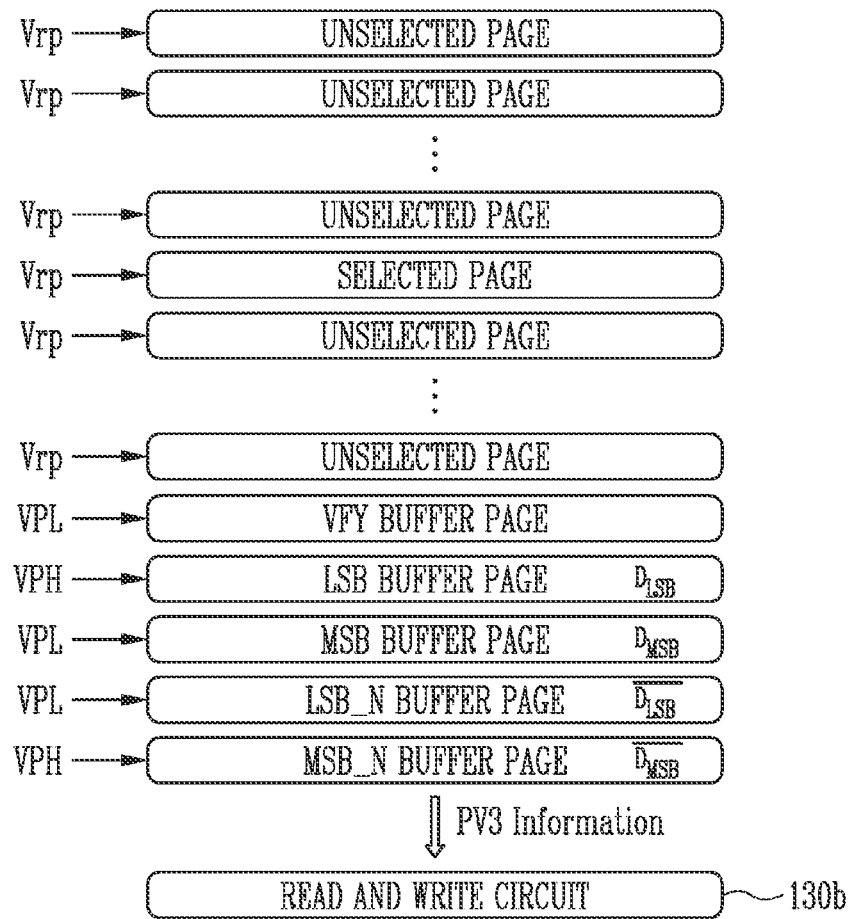
FIG. 22A is a block diagram illustrating a step of loading program incomplete cell information related to a third program state PV3 by step S430 of FIG. 17.
FIG. 22B is a table illustrating a step of loading the program incomplete cell information related to the third program state PV3 according to step S430 of FIG. 17.

FIG. 22A is a block diagram illustrating a step of loading program incomplete cell information related to the third program state PV3 by step S430 of FIG. 17. FIG. 22B is a table illustrating a step of loading the program incomplete cell information that is related to the third program state PV3 according to step S430 of FIG. 17.

Referring to FIGS. 18A and 18B, the step of loading the program incomplete cell information that is related to the first program state PV1 is described, Referring to FIGS. 21A and 21B, the step of loading the program incomplete cell information that is related to the second program state PV2 is described. An operation similar thereto may be performed to load the program incomplete cell information that is related to the third program state PV3. Therefore, a repetitive description is omitted.

Referring to FIG. 22B, a table illustrating a result of an AND operation in a bit unit on data that is stored in the inversion LSB buffer page and inversion MSB buffer page respectively is shown. Similarly to FIG. 18B or 21B, when the AND operation is performed on the data that is respectively stored in the inversion LSB buffer page and the MSB buffer page in the bit unit, the bit line that is connected to the memory cells corresponding to the third program state PV3 may be selected.

A process in which an AND operation is additionally performed on the data that is stored in the verify buffer page and the above-described result may be considered. When the AND operation is performed on the data that is stored in the inversion LSB buffer page, the MSB buffer page, and the verify buffer page in the bit unit, among the memory cells corresponding to the third program state PV3, the bit line of which the program operation is not completed may be selected.

Figures 23, 24A:
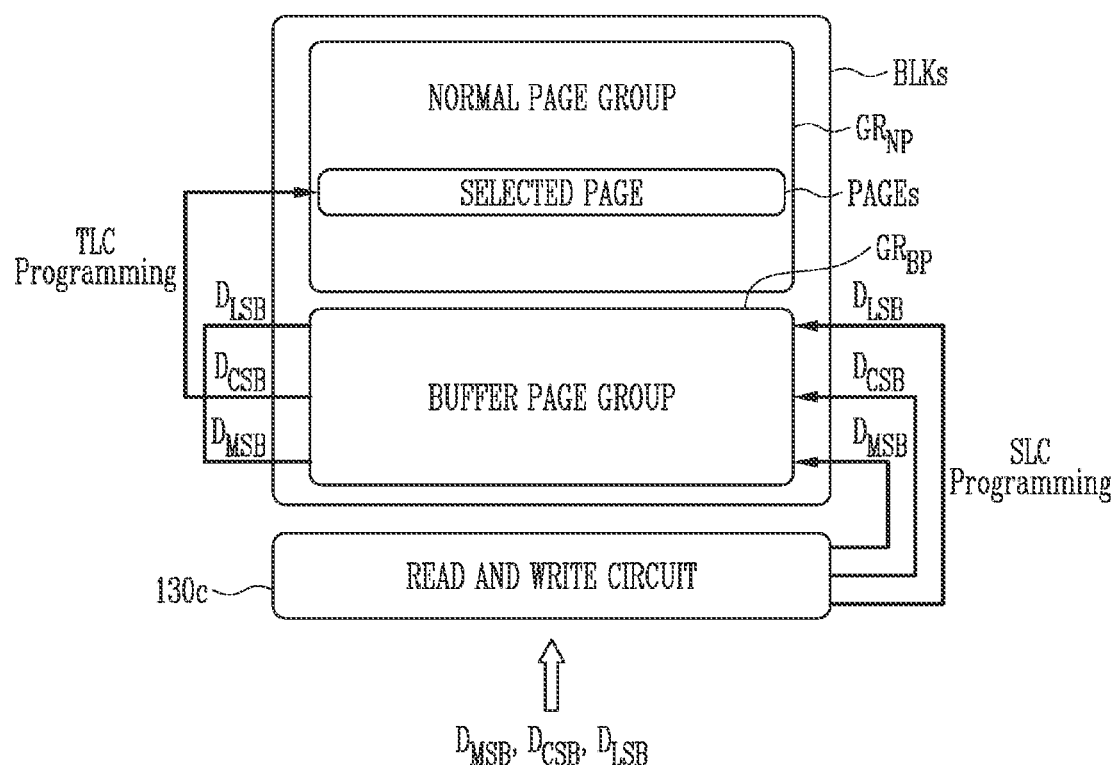
FIG. 23 is a block diagram illustrating a program operation of a semiconductor memory device according to another embodiment of the present disclosure.
FIG. 24A is a table illustrating an exemplary embodiment of a logic code for programming a triple level cell (TLC).

As a result, the PV3 information may be information that indicates the memory cell of which the program is not yet completed among the memory cells to be programmed to the third program state PV3. Specifically, among the bit lines that are connected to the read and write circuit 130b, a signal of a relatively high voltage may be transferred to the bit line that is connected to the memory cell, among the memory cells to be programmed to the third program state PV3, of which the program is not yet completed and a signal of a relatively low voltage may be transferred to the remaining bit lines. A set of such bit line signals may be the PV3 information. The PV3 information may be stored in the sensing latch group 135b of the read and write circuit 130b. The PV3 information that is stored in the sensing latch group 135b may be used for a PV3 verify operation thereafter, FIG. 23 is a block diagram illustrating a program operation of a semiconductor memory device according to another embodiment of the present disclosure. Referring to FIGS. 7 to 22, the program method of the MLC is described. However, this is an example, and the present disclosure is not limited thereto. For example, the present disclosure may be applied to a TLC program operation.

Referring to FIG. 23, the selected memory block BLKs may be divided into a normal page group $GR_{NP}$ and a buffer page group $GR_{BP}$. The buffer page group $GR_{BP}$ may include a plurality of buffer pages. The LSB page data $D_{LSB}$ may be stored in at least one of the plurality of buffer pages that are included in the buffer page group $GR_{BP}$ in an SLC program method. The CSB page data $D_{CSB}$, may be stored in at least one of the plurality of buffer pages that are included in the buffer page group $GR_{BP}$ in the SLC program method. In addition, the MSB page data $D_{MSB}$ may be stored in at least one of the plurality of buffer pages that are included in the buffer page group $GR_{BP}$ in the SLC program method.

Figure 24B:
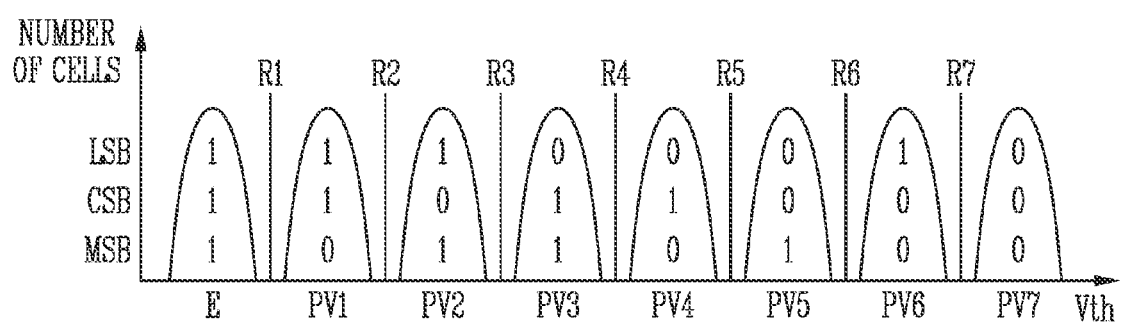
FIG. 24B is a graph illustrating a threshold voltage distribution of memory cells programmed according to the logic code shown in FIG. 24A.

Meanwhile, the normal page group $GR_{NP}$ may include a plurality of normal pages. Data may be stored in the normal pages based on the TLC program operation. A read and write circuit 130c may perform the TLC program operation on a selected page among the normal page groups $GR_{NP}$ based on the LSB page data $D_{LSB}$, the CSB page data $D_{CSB}$, and the MSB page data $D_{MSB}$ that are stored in the buffer page group $GR_{Bp}$ in the SLC program method. Accordingly, the LSB latch group, a CSB latch group, and the MSB latch group might not be required to be included in the read and write circuit 130c, and as a result, the area of the read and write circuit 130c and the peripheral circuit with the same may be reduced, FIG. 24A is a table illustrating an exemplary embodiment of a logic code for programming a TLC. FIG. 24A is an exemplary diagram of the logic code for the TLC program. However, this is an example, and various other logic codes for the TLC program may also be used, FIG. 24B is a graph illustrating a threshold voltage distribution of memory cells programmed based on the logic code shown in FIG. 24A. In FIG. 24B, a horizontal axis indicates a threshold voltage n-th of the memory cells, and a vertical axis indicates the number of memory cells corresponding to each threshold voltage.

Referring to FIG. 24B, when data is stored in the selected page based on the logic code shown in FIG. 24A, a threshold voltage state of the memory cells that are included in the selected page may be shown. The threshold voltage of the memory cells may be determined based on the LSB, the CSB, and the MSB to be stored in each memory cell. That is, the memory cells may maintain the erase state E or may be programmed to one of the first to seventh program states PV1 to PV7 based on a combination of bits to be stored, FIG. 25 is a block diagram schematically illustrating a structure of a memory block for performing a program operation of a semiconductor memory device according to an embodiment of the present disclosure.

Figure 25:
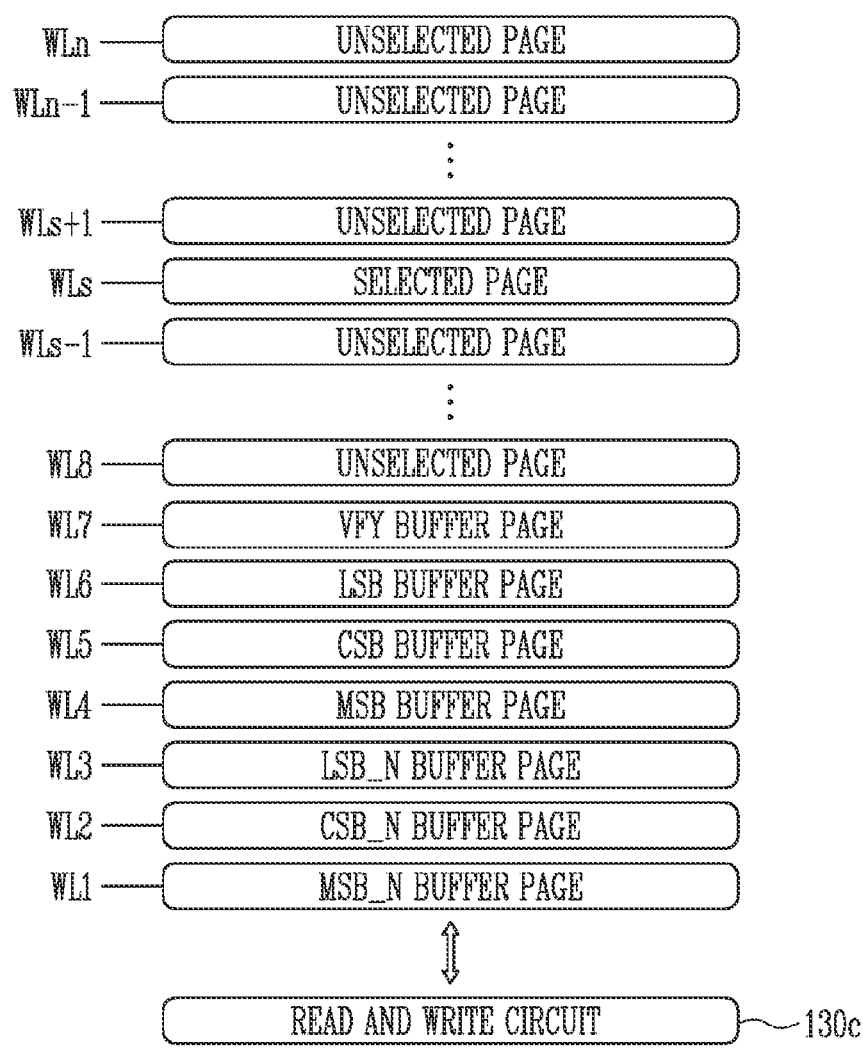
FIG. 25 is a block diagram schematically illustrating a structure of a memory block for performing a program operation of a semiconductor memory device according to an embodiment of the present disclosure.

Referring to FIG. 25, the memory block may include first to n-th pages. The first to n-th pages may be connected to the first to n-th word lines WL1 to WLn, respectively.

The buffer page group may include a verify (VFY) buffer page, an LSB buffer page, a CSB buffer page, an MSB buffer page, an inversion LSB (LSB_N) buffer page, an inversion CSB buffer page, and an inversion MSB (MSB_N) buffer page. The verify buffer page may be connected to the seventh word line WL7. The LSB buffer page may be connected to the sixth word line WL6. The CSB buffer page may be connected to the fifth word line WL5. The MSB buffer page may be connected to the fourth word line WL4, The inversion LSB (LSB_N) buffer page may be connected to the third word line WL3. The inversion CSB (CSB_N) buffer page may be connected to the second word line WL2. The inversion MSB (MSB_N) buffer page may be connected to the first word line WL1.

In an example of FIG. 25, the normal page may be connected to the eighth word line WL8 to the n-th word line WLn, Meanwhile, the selected page is connected to an s-th word line WLs among the eighth word line WL8 to the n-th word line WLn. Accordingly, eighth to (s−1)-th word lines WL8 to WLs−1 and an (s+1)-th to n-th word lines WLs+1 to WLn may be connected to an unselected page.

When the read and write circuit 130c receives the LSB page data $D_{LSB}$, the read and write circuit 130c may perform the SLC program on the LSB page data $D_{LSB}$ in the LSB buffer page. Meanwhile, the read and write circuit 130c may perform the SLC program on inverted LSB page data $\overline{D_{LSB}}$ in the inversion LSB (LSB_N) buffer page.

In addition, when the read and write circuit 130c receives the CSB page data $D_{CSB}$, the read and write circuit 130c may perform the SLC program on the CSB page data $D_{CSB}$ in the CSB buffer page. Meanwhile, the read and write circuit 130c may perform the SLC program on inverted CSB page data $\overline{D_{CSB}}$ in the inversion CSB (CSB_N) buffer page.

In addition, when the read and write circuit 130c receives the MSB page data $D_{MSB}$, the read and write circuit 130c may perform the SLC program on the MSB page data $D_{MSB}$ in the MSB buffer page. Meanwhile, the read and write circuit 130c may perform the SLC program on inversion MSB page data $\overline{D_{MSB}}$ in the inverted MSB (MSB_N) buffer page.

Meanwhile, the verify (VFY) buffer page may store verify result data that indicates whether the memory cells that are included in the selected page is programmed to a target program state. At the beginning of the program operation, each of all memory cells that are included in the verify (VFY) buffer page may store data of the erase state, that is, data of 1. As a program process proceeds, when the program of the memory cells that are included in the selected page is completed to the target program state, the SLC program may be performed on the memory cells of the verify buffer page corresponding thereto, and the memory cells may be updated to store data of 0. The read and write circuit 130c may control a bit line voltage so that the memory cells programmed to the target program state are no longer programmed based on the data that is stored in the verify buffer page.

Figures 26, 27:
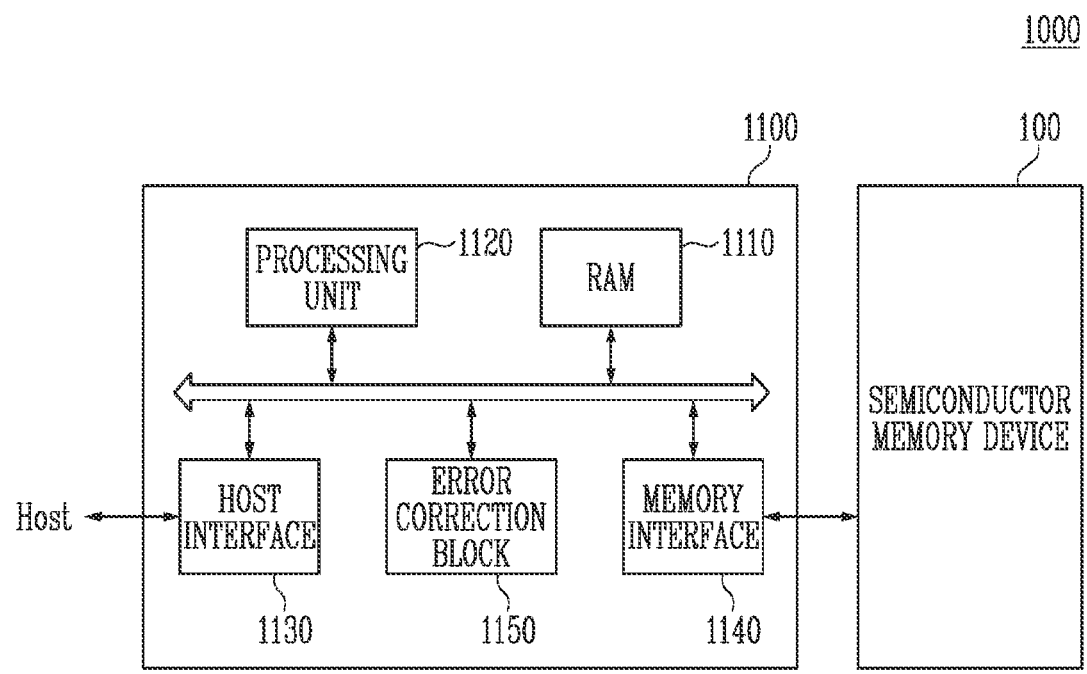
FIG. 26 is a table illustrating an exemplary embodiment of data programmed in a buffer page group and a logic code for the program operation in FIG. 25.
FIG. 27 is a block diagram illustrating a memory system 1000 with the semiconductor memory device 100 of FIG. 2.

FIG. 26 is a table illustrating an exemplary embodiment of data programmed in a buffer page group and a logic code for the program operation in FIG. 25. Similar to FIG. 15B, also in a case of the TLC program, the program state of the memory cell based on each bit data of an LSB, a CSB, an MSB, an inverted LSB (LSB_N), an inverted CSB (CSB_N), and an inverted MSB (MSB_N) may be shown as the table as shown in FIG. 26.

As described above, the semiconductor memory device and the method of operating the same, according to an embodiment of the present disclosure, may be applied to the MLC in which one memory cell stores two bits of data and the TLC in which one memory cell stores three bits of data. In addition, the present disclosure is not limited thereto and may be applied to the QLC in which one memory cell stores four bits of data and a memory cell in which one memory cell stores more than four bits of data. That is, the semiconductor memory device and the method of operating the same according to an embodiment of the present disclosure may be applied to a multiple-level program operation in which one memory cell stores two or more bits of data.

FIG. 27 is a block diagram illustrating a memory system 1000 with the semiconductor memory device 100 of FIG. 2.

Referring to FIG. 27, the memory system 1000 may include the semiconductor memory device 100 and the controller 1100, The semiconductor memory device 100 may be the semiconductor memory device that is described with reference to FIG. 2. Hereinafter, repetitive description is omitted.

The controller 1100 may be connected to the host Host and the semiconductor memory device 100. The controller 1100 may be configured to access the semiconductor memory device 100 in response to the request from the host Host. For example, the controller 1100 may be configured to control read, write, erase, and background operations of the semiconductor memory device 100. The controller 1100 may be configured to provide an interface between the semiconductor memory device 100 and the host Host. The controller 1100 may be configured to drive firmware for controlling the semiconductor memory device 100.

The controller 1100 may include a random access memory (RAM) 1110, a processing unit 1120, a host interface 1130, a memory interface 1140, and an error correction block 1150. The RAM 1110 is used as one of an operation memory of the processing unit 1120, a cache memory between the semiconductor memory device 100 and the host Host, and a buffer memory between the semiconductor memory device 100 and the host Host. The processing unit 1120 may control overall operations of the controller 1100. In addition, the controller 1100 may temporarily store program data provided from the host Host during the write operation.

The host interface 1130 may include a protocol for performing data exchange between the host Host and the controller 1100. In an exemplary embodiment, the controller 1100 may be configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface may include a NAND interface or a NOR interface.

The error correction block 1150 may be configured to detect and correct an error of data received from the semiconductor memory device 100 using an error correcting code (ECC). In an exemplary embodiment, the error correction block may be provided as a component of the controller 1100.

The controller 1100 and the semiconductor memory device 100 may be integrated into one semiconductor device. In an exemplary embodiment, the controller 1100 and the semiconductor memory device 100 may be integrated into one semiconductor device to configure a memory card. For example, the controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 1100 and the semiconductor memory device 100 may be integrated into one semiconductor device to form a semiconductor drive (solid state drive (SSD)). The semiconductor drive (SSD) may include a storage device configured to store data in a semiconductor memory. When the memory system 1000 is used as the semiconductor drive (SSD), an operation speed of the host Host that is connected to the memory system 1000 may be dramatically improved.

In another example, the memory system 1000 may be provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an exemplary embodiment, the semiconductor memory device 100 or the memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSCP), a thin small outline (TSOP), a system in package (SIP), a multi-chip package (MCP), a wafer-level fabricated package (WFP), or a wafer-level processed stack package (WSP).

Figure 28:
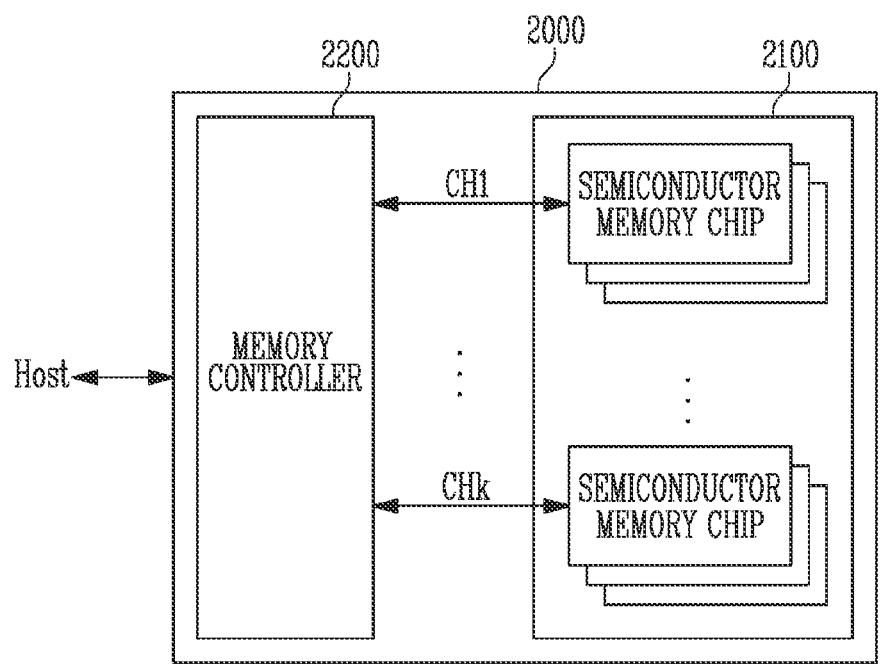
FIG. 28 is a block diagram illustrating an application example of the memory system of FIG. 27.

FIG. 28 is a block diagram illustrating an application example of the memory system of FIG. 27.

Referring to FIG. 28, the memory system 2000 may include a semiconductor memory device 2100 and a memory controller 2200. The semiconductor memory device 2100 may include a plurality of semiconductor memory chips. The plurality of semiconductor memory chips may be divided into a plurality of groups.

In FIG. 28, the plurality of groups may communicate with the memory controller 2200 through first to k-th channels CH1 to CHk, respectively. Each semiconductor memory chip may be configured and operated similarly to that of the semiconductor memory device 100 described with reference to FIG. 2.

Each group may be configured to communicate with the controller 2200 through one common channel. The memory controller 2200 may be configured similarly to the controller 1100 that is described with reference to FIG. 27 and may be configured to control the plurality of memory chips of the semiconductor memory device 2100 through the plurality of channels CH1 to CHk.

Figure 29:
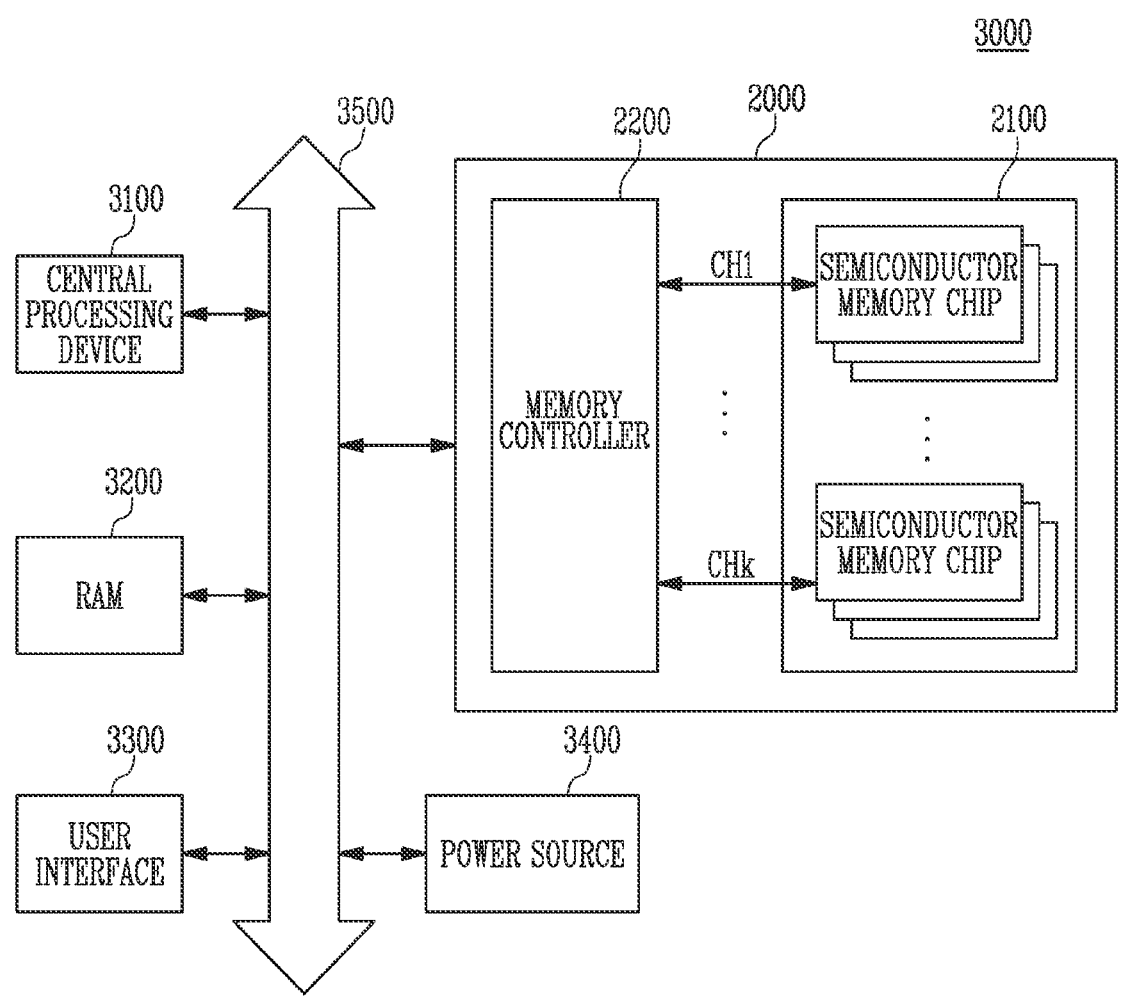
FIG. 29 is a block diagram illustrating a computing system with the memory system described with reference to FIG. 28.

FIG. 29 is a block diagram illustrating a computing system with the memory system that is described with reference to FIG. 28.

The computing system 3000 may include a central processing device 3100, a random access memory (RAM) 3200, a user interface 3300, a power source 3400, a system bus 3500, and the memory system 2000.

The memory system 2000 may be electrically connected to the central processing device 3100, the RAM 3200, the user interface 3300, and the power source 3400 through the system bus 3500. Data provided through the user interface 3300 or processed by the central processing device 3100 may be stored in the memory system 2000.

In FIG. 29, the semiconductor memory device 2100 may be connected to the system bus 3500 through the memory controller 2200. However, the semiconductor memory device 2100 may be configured to be directly connected to the system bus 3500. At this time, a function of the memory controller 2200 may be performed by the central processing device 3100 and the RAM 3200.

In FIG. 29, the memory system 2000 that is described with reference to FIG. 28 is provided. However, the memory system 2000 may be replaced with the memory system 1000 described with reference to FIG. 27. In an exemplary embodiment, the computing system 3000 may be configured to include both of the memory systems 1000 and 2000 described with reference to FIGS. 27 and 28.

What is claimed is:

1. A semiconductor memory device comprising:
    a memory block including a plurality of non-volatile memory cells; and
    a peripheral circuit configured to perform a program operation on the memory block,
    wherein the memory block includes a plurality of normal pages and a plurality of buffer pages, each of the plurality of normal pages includes non-volatile memory cells that store N bits of data (N being a natural number that is equal to or greater than 2) and each of the plurality of buffer pages includes non-volatile memory cells that store one bit of data, and
    wherein the peripheral circuit is configured to:
        receive a first page data and perform a single level cell (SLC) program on the first page data in at least a first buffer page among the plurality of buffer pages;
        invert the first page data and perform the SLC program on the inverted first page data in a first inversion buffer page among the plurality of buffer pages;
        receive a second page data and perform the SLC program on the second page data in at least a second buffer page among the plurality of buffer pages;
        invert the second page data and perform the SLC program on the inverted second page data in a second inversion buffer page among the plurality of buffer pages; and
        perform a multi-level program operation on a selected normal page among the plurality of normal pages based on the first page data that is programmed in the first buffer page and the second page data that is programmed in the second buffer page.

2. The semiconductor memory device of claim 1, wherein the peripheral circuit is configured to perform the SLC program on a verify buffer page among the plurality of buffer pages based on a first verify information, indicating whether a program of non-volatile memory cells that is to be programmed in at least one target program state is completed.

3. The semiconductor memory device of claim 2, wherein the N is 2,
    and the multi-level program operation is a multi-level cell (MLC) program operation.

4. The semiconductor memory device of claim 2, wherein the peripheral circuit is configured to check whether a program of each non-volatile memory cell among the plurality of non-volatile memory cells that are included in the selected normal page is completed by selectively applying one of a low pass voltage or a high pass voltage to a word line connected to each of the verify buffer page, the first buffer page, the second buffer page, the first inversion buffer page, and the second inversion buffer page, wherein the low pass voltage is a voltage that is capable of turning on a non-volatile memory cell of an erase state and turning off a non-volatile memory cell of a program state among non-volatile memory cells that are included in the first and second buffer pages on which the SLC program is performed, and wherein the high pass voltage is a voltage that is capable of turning on all non-volatile memory cells that are included in the first and second buffer pages on which the SLC program is performed.

5. The semiconductor memory device of claim 1, wherein the peripheral circuit is configured to further receive a third page data, perform the SLC program on the third page data in at least a third buffer page among the plurality of buffer pages, and perform the multi-level program operation on the selected normal page based on the first page data programmed in the first buffer page, the second page data programmed in the second buffer page, and the third page data programmed in the third buffer page.

6. The semiconductor memory device of claim 5, wherein the peripheral circuit is configured to invert the third page data and perform the SLC program on the inverted third page data in a third inversion buffer page among the plurality of buffer pages.

7. The semiconductor memory device of claim 6, wherein the N is 3, and the multi-level program operation is a triple-level cell (TLC) program operation.

8. The semiconductor memory device of claim 7, wherein the peripheral circuit checks whether a program of each non-volatile memory cell among the plurality of non-volatile memory cells that are included in the selected normal page is completed by selectively applying a combination of a voltage that is selected from a low pass voltage and a high pass voltage to a word line connected to each of a verify buffer page, the first buffer page, the second buffer page, the third buffer page, the first inversion buffer page, the second inversion buffer page, and the third inversion buffer page, wherein the low pass voltage is a voltage that is capable of turning on a non-volatile memory cell of an erase state and turning off a non-volatile memory cell of a program state among non-volatile memory cells that is included in the first, second, and third buffer pages on which the SLC program is performed, and wherein the high pass voltage is a voltage that is capable of turning on all non-volatile memory cells that are included in the first, second, and third buffer pages on which the SLC program is performed.

9. A method of operating a semiconductor memory device for programming data in a memory block including a plurality of buffer pages belonging to a buffer page group and a plurality of normal pages belonging to a normal page group, each including a plurality of non-volatile memory cells, the method comprising:

performing a first SLC program operation that stores the first program data in at least one buffer page among the buffer pages that are included in the buffer page group;

performing a second SLC program operation that store the second program data in at least another buffer page among the buffer pages that are included in the buffer page group; and performing a multi-level program operation on the normal page group based on the first and second program data that are programmed in the buffer page group, wherein the performing of the first SLC program operation comprises:

programming the first program data in a first buffer page among the buffer pages in an SLC method; and inverting the first program data and programming the inverted first program data in a first inversion buffer page among the buffer pages in the SLC method.

10. The method of claim 9, wherein the performing of the second SLC program operation comprises:

programming the second program data in a second buffer page among the buffer pages in the SLC method; and inverting the second program data and programming the inverted second program data in a second inversion buffer page among the buffer pages in the SLC method.

11. The method of claim 10, wherein the performing of the multi-level program operation on the normal page group based on the first and second program data that are programmed in the buffer page group comprises:

setting a bit line voltage for a program of a selected normal page among normal pages that are included in the normal page group;

applying a program pass voltage to word lines that are connected to unselected normal pages, and applying a program voltage to a word line connected to the selected normal page; and loading program incomplete cell information for non-volatile memory cells of which a program is not completed to a target program state among non-volatile memory cells that are included in the selected normal page based on data that is stored in a verify buffer page, the first buffer page, the second buffer page, the first inversion buffer page, and the second inversion buffer page that are included in the buffer page group.

12. The method of claim 11, wherein the loading of the program incomplete cell information for the non-volatile memory cells of which the program is not completed to the target program state among the non-volatile memory cells that are included in the selected normal page comprises checking whether a program of non-volatile memory cells that is to be programmed to a selected target program state among a plurality of target program states is completed by selectively applying one of a low pass voltage or a high pass voltage to word lines connected to each of the verify buffer page, the first buffer page, the second buffer page, the first inversion buffer page, and the second inversion buffer page, wherein the low pass voltage is a voltage that is capable of turning on a non-volatile memory cell of an erase state and turning off a non-volatile memory cell of a program state among non-volatile memory cells that are included in buffer pages on which the SLC program operation is performed, and wherein the high pass voltage is a voltage that is capable of turning on all non-volatile memory cells that are included in the buffer pages on which the SLC program operation is performed.

13. The method of claim 12, further comprising:

applying a verify voltage corresponding to the target program state to a word line connected to the selected normal page, and applying a read pass voltage to a word line connected to the unselected normal pages;

setting bit line voltages for a subsequent program operation of the selected normal page in response to a result of applying the verify voltage; and applying a program pass voltage to a word line connected to remaining pages except for the verify buffer page, applying a program voltage to a word line connected to the verify buffer page, and updating data that is stored in the verify buffer page.

14. A semiconductor memory device comprising:

a memory block including a plurality of non-volatile memory cells; and a peripheral circuit configured to perform a program operation on the memory block, wherein the memory block includes a plurality of normal pages and a plurality of buffer pages, wherein each of the plurality of normal pages including non-volatile memory cells stores N bits of data (N being a natural number that is equal to or greater than 2) and each of the plurality of buffer pages including non-volatile memory cells stores one bit of data, and wherein the peripheral circuit is configured to:
receive a page data and perform a single level cell (SLC) program on the page data in at least one buffer page among the plurality of buffer pages;

perform a SLC program on an inverted page data generated by inverting the page data in at least another buffer page among the plurality of buffer pages;

perform a multi-level program operation on a selected normal page among the plurality of normal pages based on the page data and the inverted page data that are programmed in the at least one buffer page and the at least another buffer page, respectively.

* * * * *